(12) United States Patent
Motai et al.

(10) Patent No.: US 12,532,491 B2
(45) Date of Patent: Jan. 20, 2026

(54) SEMICONDUCTOR DEVICE HAVING FIRST AND SECOND REGIONS EXTENDING IN DIFFERENT DIRECTIONS IN TERMINATION REGION AND MANUFACTURING METHOD THEREOF

(71) Applicants: Kabushiki Kaisha Toshiba, Tokyo (JP); Toshiba Electronic Devices & Storage Corporation, Tokyo (JP)

(72) Inventors: Takako Motai, Kanagawa (JP); Yoko Iwakaji, Tokyo (JP); Kaori Fuse, Kanagawa (JP); Hiroko Itokazu, Kanagawa (JP); Keiko Kawamura, Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 330 days.

(21) Appl. No.: 18/113,519

(22) Filed: Feb. 23, 2023

(65) Prior Publication Data

US 2024/0105820 A1  Mar. 28, 2024

(30) Foreign Application Priority Data

Sep. 22, 2022 (JP) .................................. 2022-151838

(51) Int. Cl.
*H10D 12/00* (2025.01)
*H10D 12/01* (2025.01)
(Continued)

(52) U.S. Cl.
CPC ......... *H10D 12/481* (2025.01); *H10D 12/038* (2025.01); *H10D 62/127* (2025.01); *H10D 64/112* (2025.01)

(58) Field of Classification Search
CPC .. H10D 12/481; H10D 12/038; H10D 62/127; H10D 64/112
See application file for complete search history.

(56) References Cited

U.S. PATENT DOCUMENTS 10,964,809 B2   3/2021   Noborio et al.
11,101,345 B2   8/2021   Murasaki
(Continued)

FOREIGN PATENT DOCUMENTS

CN   107425054 A   12/2017
CN   110444587 A   11/2019
(Continued)

OTHER PUBLICATIONS

Japanese Office Action mailed Aug. 29, 2025 in corresponding Japanese Patent Application 2022-151838 with English Translation, 6 pages.

*Primary Examiner* — Michael Jung
(74) *Attorney, Agent, or Firm* — Kim & Stewart LLP

(57) ABSTRACT

A semiconductor device according to an embodiment includes a semiconductor substrate, a cell region, and a termination region. The termination region surrounds the cell region and includes a plurality of first diffusion layers containing a first conductivity type impurity. In a cross-section of the termination region in a first direction perpendicular to the first face, at least one of the plurality of first diffusion layers includes a first region extending in the first direction from the first face toward a second face of the semiconductor substrate, and a second region extending in a second direction orthogonal to the first direction from the first region. The concentration of the first conductivity type impurity contained in the second region is lower than the concentration of the first conductivity type impurity contained in the first region.

20 Claims, 27 Drawing Sheets

(51) Int. Cl.
 *H10D 62/10* (2025.01)
 *H10D 64/00* (2025.01)

(56) References Cited

U.S. PATENT DOCUMENTS

| | | |
|---|---|---|
| 2005/0098826 A1 | 5/2005 | Yamaguchi et al. |
| 2007/0272979 A1 | 11/2007 | Saito et al. |
| 2013/0037851 A1* | 2/2013 | Gejo .................... H10D 12/461 |
| | | 257/493 |
| 2014/0035110 A1 | 2/2014 | Watanabe |
| 2015/0255536 A1 | 9/2015 | Sugita |
| 2017/0243937 A1 | 8/2017 | Ward et al. |
| 2019/0088737 A1* | 3/2019 | Tamaki .................. H10D 62/60 |
| 2021/0184030 A1* | 6/2021 | Tanaka ................. H10D 62/115 |
| 2022/0190105 A1* | 6/2022 | Kim ................... H10D 62/8325 |
| 2023/0299131 A1* | 9/2023 | Yao ....................... H01L 21/266 |
| | | 257/341 |

FOREIGN PATENT DOCUMENTS

| | | |
|---|---|---|
| JP | 2015-170667 A | 9/2015 |
| JP | 2018148000 A | 9/2018 |
| JP | 6870546 B2 | 5/2021 |
| JP | 2022-03711 A | 1/2022 |
| WO | 2018-207712 A1 | 11/2018 |

\* cited by examiner

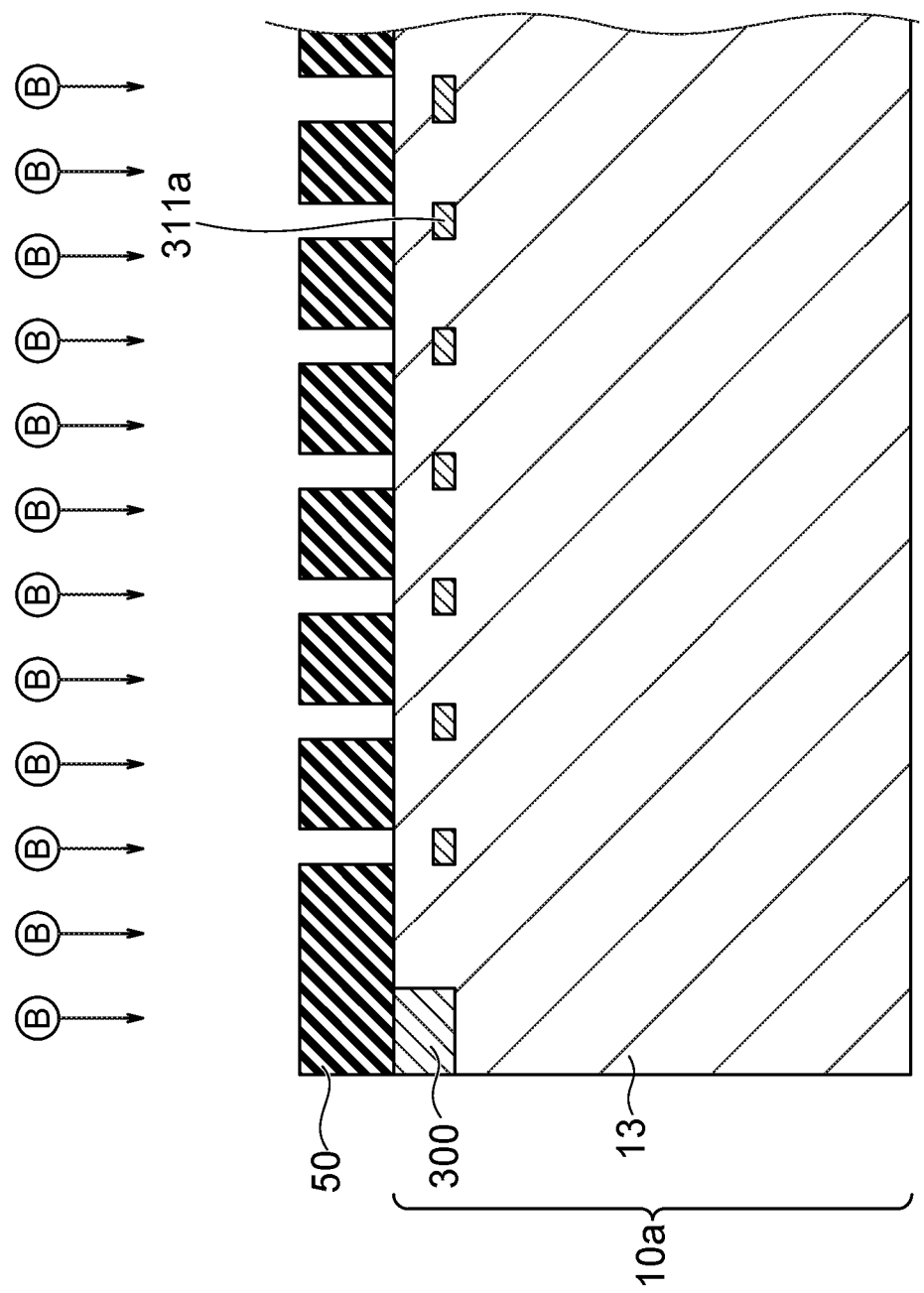

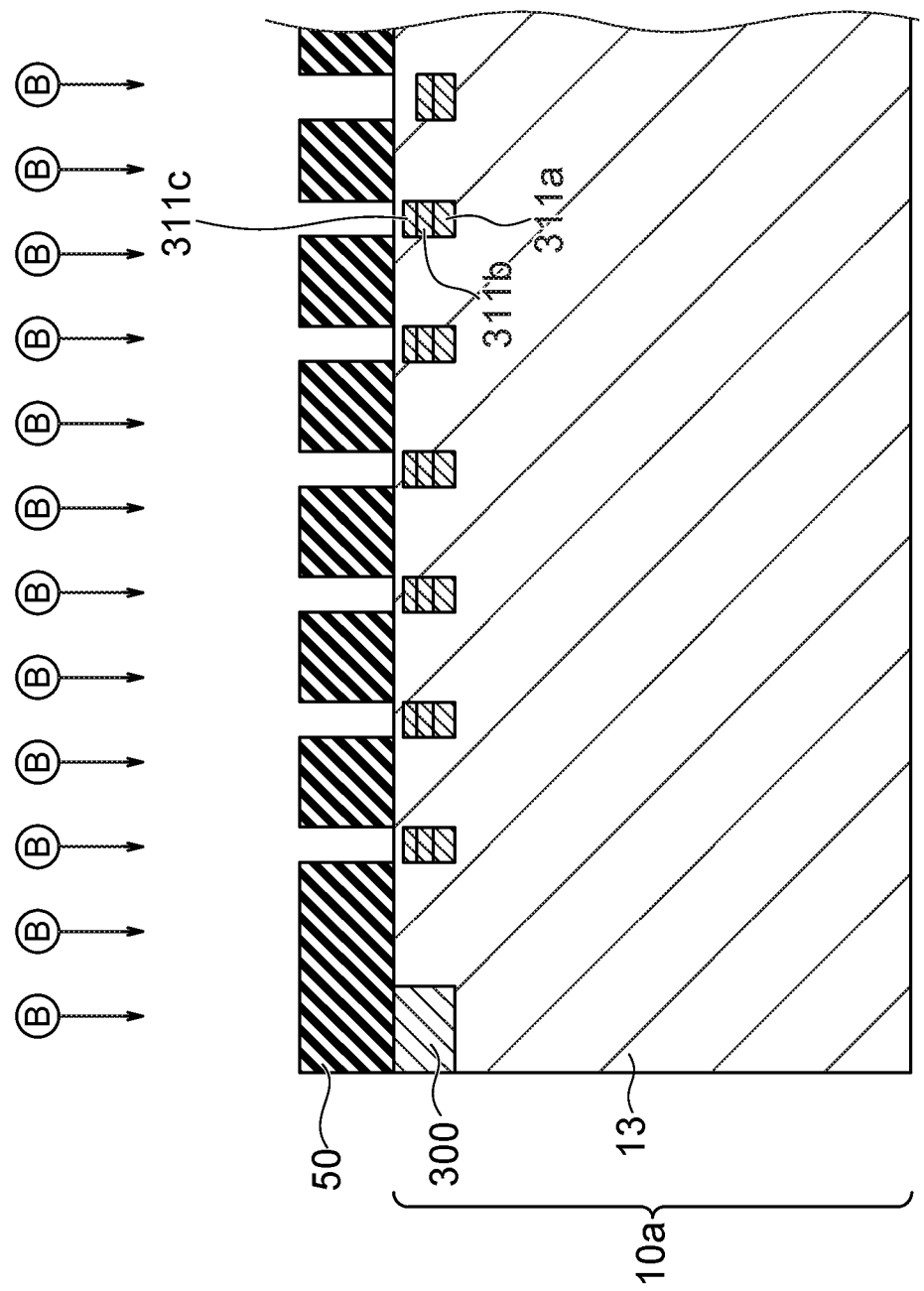

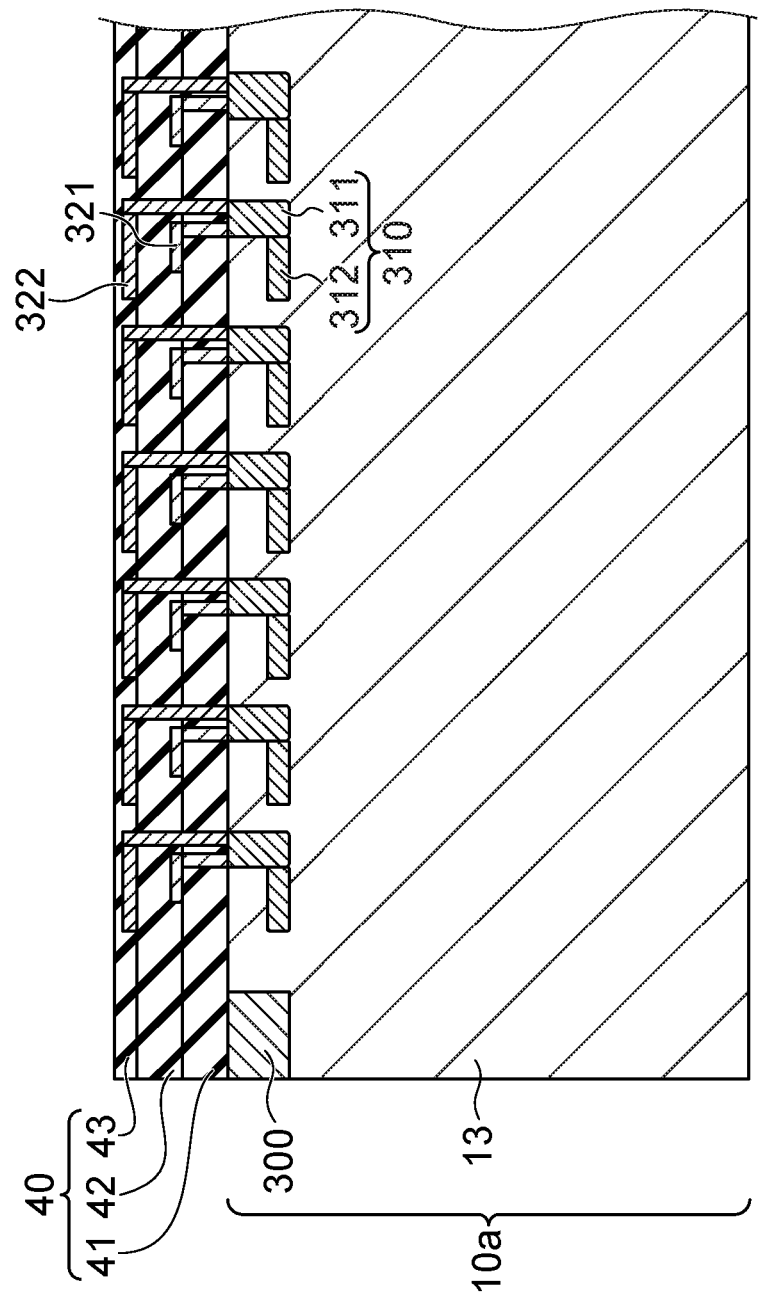

SEMICONDUCTOR DEVICE HAVING FIRST AND SECOND REGIONS EXTENDING IN DIFFERENT DIRECTIONS IN TERMINATION REGION AND MANUFACTURING METHOD THEREOF

CROSS-REFERENCE TO RELATED APPLICATIONS

This application is based upon and claims the benefit of priority from Japanese Patent Application No. 2022-151838, filed on Sep. 22, 2022; the entire contents of which are incorporated herein by reference.

FIELD

The present invention relates to a semiconductor device and a manufacturing method for the same.

BACKGROUND

A termination region of a power semiconductor device such as an IGBT (Insulated Gate Bipolar Transistor) generally includes a structure with a plurality of p-type semiconductor layers, which are called guard rings, disposed to maintain the breakdown voltage. In the guard ring termination structure, the electric field is intensified around the p-type semiconductor layer. Therefore, it is important to form the p-type semiconductor layer in a deep semi-circular shape to secure the breakdown voltage. However, in a guard ring layer having such a cross-sectional shape, the lateral width of the termination region is increased. Therefore, the area occupied by the termination region in the power semiconductor device is enlarged, which is an obstacle in achieving downsizing of the device.

Thus, there is a method for reducing the area of the termination region by forming a guard ring layer having a rectangular cross-sectional shape formed by a low-temperature heat treatment. However, in the rectangular guard ring layer, the curvature of a corner portion is small. Therefore, the electric field concentrates near the corner portion, which could decrease the breakdown voltage.

BRIEF DESCRIPTION OF THE DRAWINGS

FIG. 2A is a cross-sectional view showing a step of forming a first p-type impurity layer;

FIG. 2C is a cross-sectional view showing a step of forming a third p-type impurity layer;

FIG. 10G is a cross-sectional view showing a step of forming a passivation film;

DETAILED DESCRIPTION

Embodiments will now be explained with reference to the accompanying drawings. The present invention is not limited to the embodiments.

A semiconductor device according to an embodiment includes a semiconductor substrate, a cell region on a side of a first face of the semiconductor substrate, and a termination region on an outer side of the cell region on the side of the first face of the semiconductor substrate. The termination region continuously surrounds the cell region and includes a plurality of first diffusion layers containing a first conductivity type impurity. In a cross-section of the termination region in a first direction perpendicular to the first face, at least one of the plurality of first diffusion layers includes a first region extending in the first direction from the first face toward a second face of the semiconductor substrate, and a second region extending in a second direction orthogonal to the first direction from the first region. The concentration of the first conductivity type impurity contained in the second region is lower than the concentration of the first conductivity type impurity contained in the first region.

First Embodiment

Figure 1:
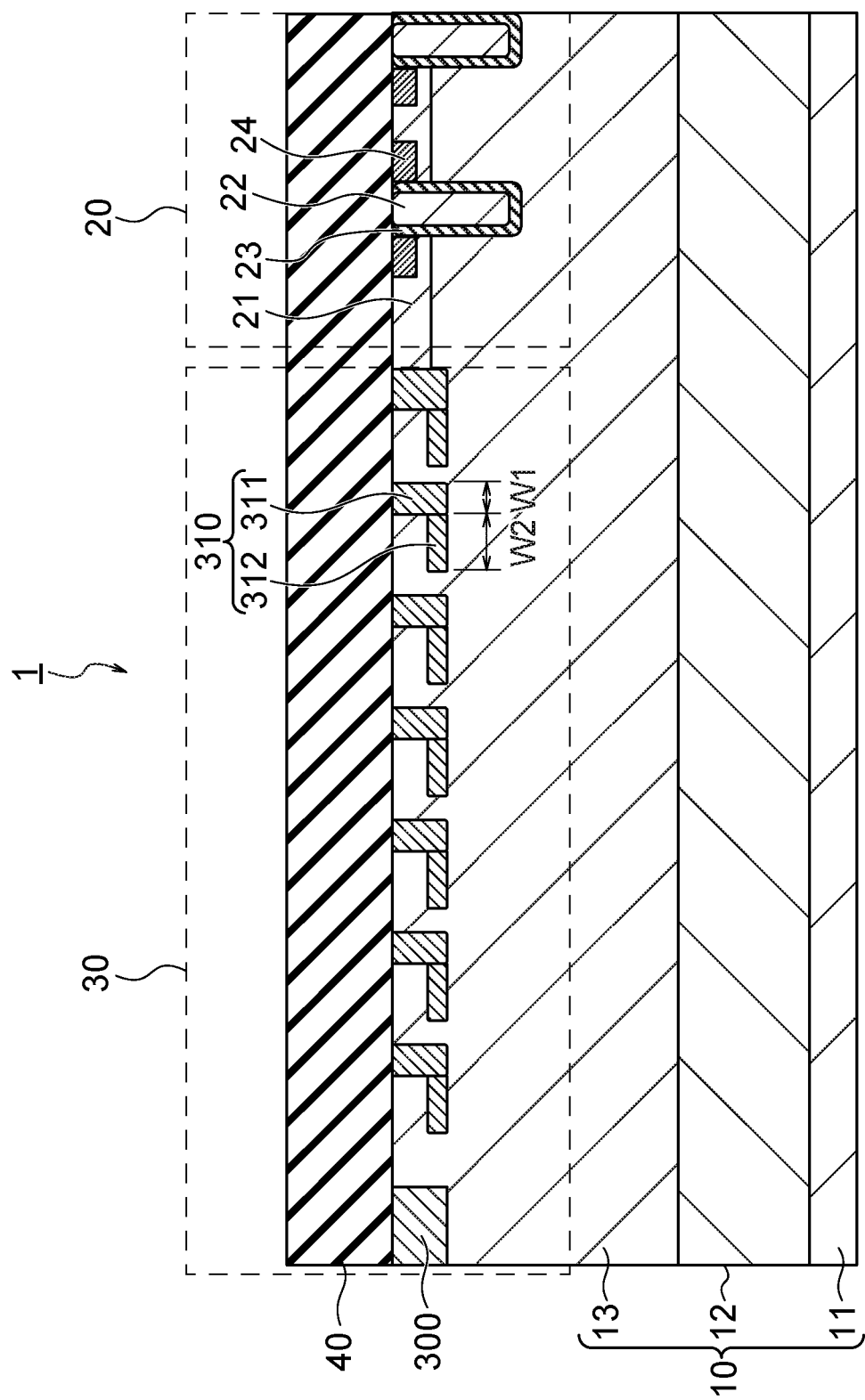
FIG. 1 is a cross-sectional view showing the schematic structure of a semiconductor device according to a first embodiment.

FIG. 1 is a cross-sectional view showing the schematic structure of a semiconductor device according to a first embodiment. A semiconductor device 1 shown in FIG. 1 is an IGBT having a trench gate structure. The semiconductor device 1 includes a cell region 20 and a termination region 30 on a front face side of a semiconductor substrate 10. Further, the cell region 20 and the termination region 30 are covered with an inter layer dielectric 40. The inter layer dielectric 40 is formed of a silicon dioxide ($SiO_2$) film, for example. Note that the semiconductor device 1 is not limited to a trench-gate IGBT, but may be a planar-gate IGBT, for example.

The semiconductor substrate 10 includes a p-type collector layer 11, an n-type buffer layer 12, and an n-type base layer 13. Hereinafter each layer will be described.

The p-type collector layer 11 is disposed in the lowermost layer of the semiconductor substrate 10. The p-type collector layer 11 functions as an IGBT collector. The thickness of the p-type collector layer 11 is 0.2 μm, for example.

The n-type buffer layer 12 is stacked on the p-type collector layer 11. The concentration of an n-type impurity contained in the n-type buffer layer 12 is higher than the concentration of the n-type impurity contained in the n-type base layer 13. The thickness of the n-type buffer layer 12 is 1 μm, for example.

The n-type base layer 13 is stacked on the n-type buffer layer 12. The n-type base layer 13 corresponds to a first semiconductor layer and the front face side (the side of the first face) is provided with the cell region 20 and the termination region 30.

First, the cell region 20 will be described. The cell region 20 includes a p-type base layer 21, a gate electrode 22, a gate insulation film 23, and an n-type emitter layer 24.

The p-type base layer 21 corresponds to a second diffusion layer and is provided on the front face of the semiconductor substrate 10 (the n-type base layer 13). The concentration of a p-type impurity of the p-type base layer 21 is lower than the concentration of the p-type impurity contained in a first region 311 of a guard ring layer 310 provided in the termination region 30, which will be described later.

The gate electrode 22 extends through the p-type base layer 21 from the front face of the semiconductor substrate 10 and terminates in the n-type base layer 13. The gate electrode 22 includes polysilicon, for example.

The gate insulation film 23 electrically insulates the gate electrode 22 from the n-type base layer 13, the p-type base layer 21, and the n-type emitter layer 24. The gate insulation film 23 is a silicon dioxide film, for example.

The n-type emitter layer 24 corresponds to a third diffusion layer containing an n-type impurity and opposes the gate electrode 22 via the gate insulation film 23 within the p-type base layer 21. The n-type emitter layer 24 functions as an emitter of the IGBT.

Next, the termination region 30 disposed on an outer side of the cell region 20 will be described. The termination region 30 includes an n-type EQPR (Equivalent-Potential Ring) layer 300 and a plurality of guard ring layers 310.

The EQPR layer 300 is disposed on the outermost side of the termination region 30. The concentration of an n-type impurity contained in the EQPR layer 300 is higher than the concentration of the n-type impurity contained in the n-type base layer 13. The EQPR layer 300 has the same electric potential as that of the p-type collector layer 11.

The plurality of guard ring layers 310 is each formed of a p-type diffusion layer in a ring continuously surrounding the cell region 20. In the present embodiment, seven guard ring layers are provided in the termination region 30, but the number of the guard ring layers only needs to be more than one.

As shown in FIG. 1, the guard ring layer 310 according to the present embodiment includes the first region 311 and a second region 312 in a cross-section of the termination region 30 in the first direction perpendicular to the front face of the semiconductor substrate 10. Hereinafter, each diffusion region will be described.

The first region 311 extends in the above-described first direction from the front face toward a back face (the second face) of the semiconductor substrate 10. The concentration of a p-type impurity contained in the first region 311 is higher than the concentration of the p-type impurity contained in the p-type base layer 21 of the cell region 20.

The second region 312 extends in the second direction (the direction parallel to the front face of the semiconductor substrate 10) orthogonal to the above-described first direction from the vicinity of a bottom portion of the first region 311. In the present embodiment, the second region 312 projects from the bottom portion of the first region 311 toward the EQPR layer 300 side. Further, a width (W1+W2) of the bottom portion of each guard ring layer 310 is greater than a width (W1) of an upper portion of each guard ring layer 310 positioned on the front face side of the semiconductor substrate 10. Furthermore, as shown in FIG. 1, an upper portion of the second region 312 is provided with the n-type base layer 13 that is an n-type semiconductor layer.

Note that in the present embodiment, the guard ring layers 310 all have the first region 311 and the second region 312. However, a part of the guard ring layers 310, for example, the guard ring layer 310 disposed closest to the cell region 20 may only have the first region 311, without having the second region 312.

Hereinafter, a manufacturing method for the above-described semiconductor device according to the first embodiment will be described with reference to FIG. 2A to FIG. 2H. Here, the step of manufacturing the termination region 30 will mainly be described.

First, as shown in FIG. 2A, a resist 50 is formed on the front face of a semiconductor substrate 10a formed of the n-type base layer 13. The resist 50 is patterned so as to open a portion where the first region 311 of the guard ring layer 310 is formed.

Then, the resist 50 is irradiated with boron (B) ions from above. At this time, for example, the dose amount of the boron ions is set to $1 \times 10^{13}$ cm$^{-2}$, and the acceleration voltage is set to 3.5 MeV. As a result, as shown in FIG. 2A, a first p-type impurity layer 311a is formed inside the n-type base layer 13.

Figure 2B:
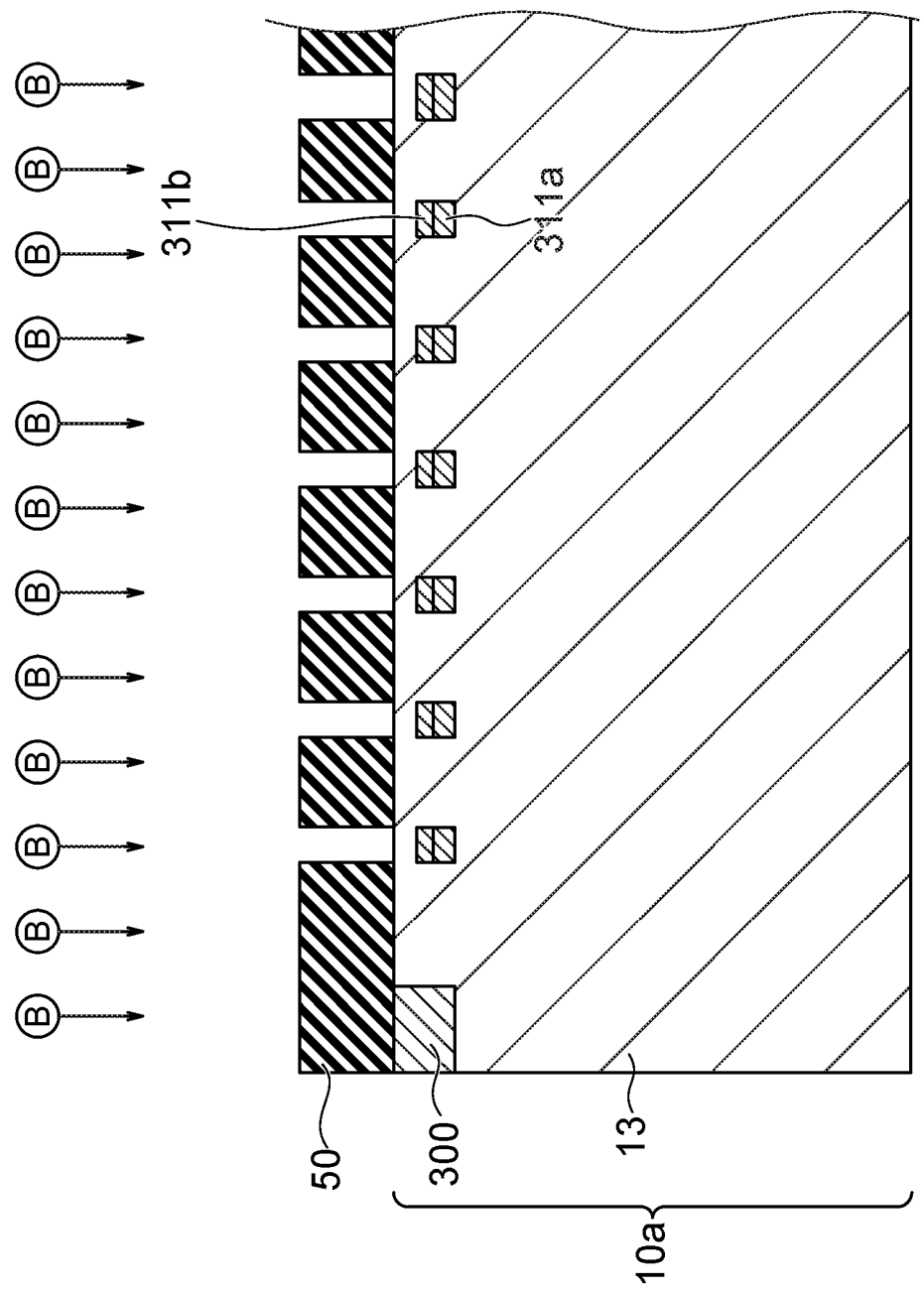
FIG. 2B is a cross-sectional view showing a step of forming a second p-type impurity layer.

Next, as shown in FIG. 2B, the boron (B) ions are irradiated by changing the irradiation conditions. At this time, the dose amount of the boron ions is set to, for example, $3 \times 10^{13}$ cm$^{-2}$, which is increased as compared to the dose amount set at the time of forming the first p-type impurity layer 311a. Further, the acceleration voltage is set to, for example, 2 MeV, which is reduced as compared to the acceleration voltage at the time of forming the first p-type impurity layer 311a. As a result, as shown in FIG. 2B, a second p-type impurity layer 311b is formed on the first p-type impurity layer 311a.

Then, as shown in FIG. 2C, the boron (B) ions are irradiated by further changing the irradiation conditions. At this time, the dose amount of the boron ions is set to, for example, $1 \times 10^{14}$ cm$^{-2}$, which is increased as compared to the dose amount set at the time of forming the second p-type impurity layer 311b. Further, the acceleration voltage is set to, for example, 1 MeV, which is reduced as compared to the acceleration voltage at the time of forming the second p-type impurity layer 311b. As a result, as shown in FIG. 2C, a third p-type impurity layer 311c is formed on the second p-type impurity layer 311b.

Figure 2D:
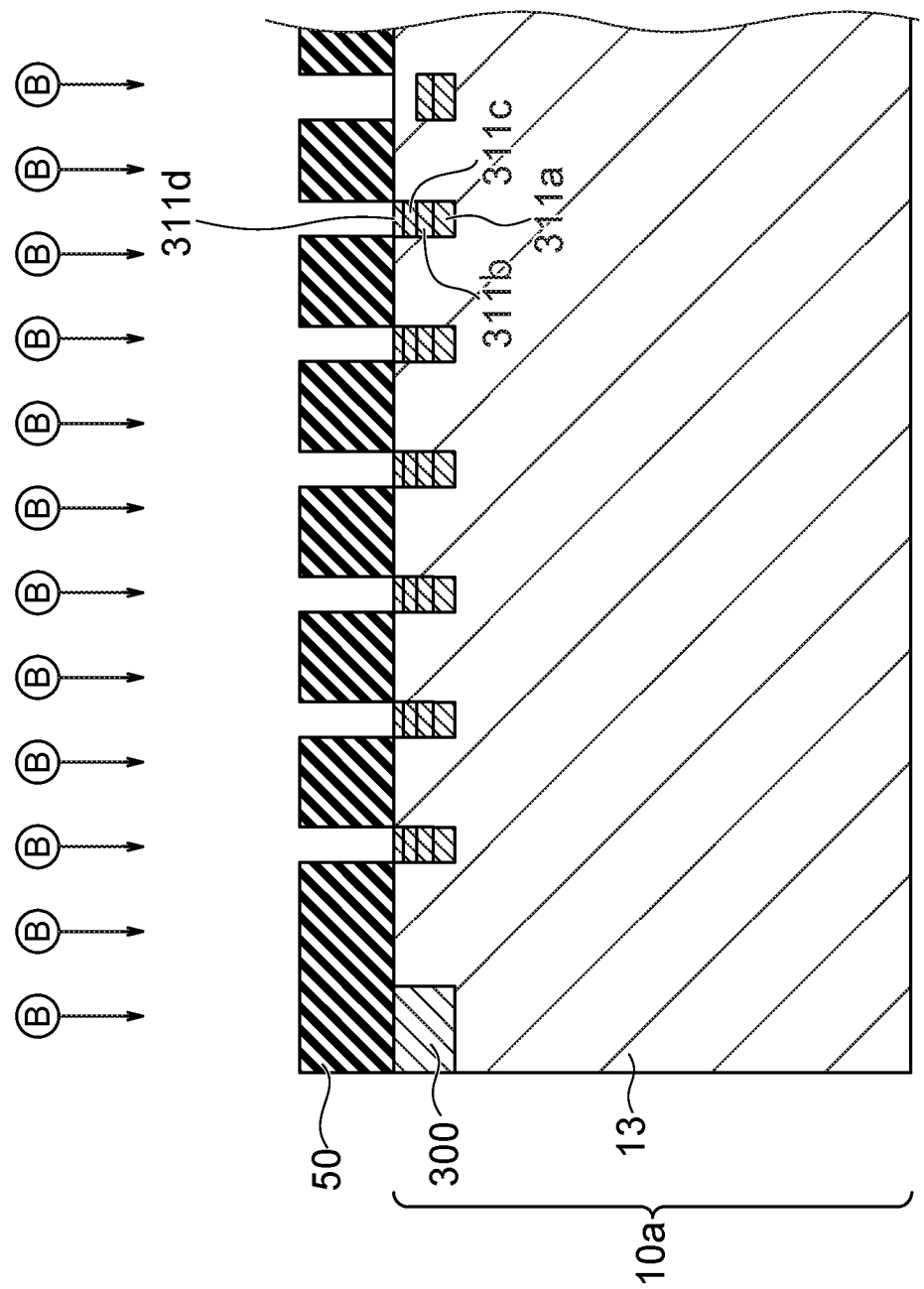
FIG. 2D is a cross-sectional view showing a step of forming a fourth p-type impurity layer.

Next, as shown in FIG. 2D, the boron (B) ions are irradiated by further changing the irradiation conditions. At this time, the dose amount of the boron ions is set to, for example, $3 \times 10^{14}$ cm$^{-2}$, which is increased as compared to the dose amount set at the time of forming the third p-type impurity layer 311c. Further, the acceleration voltage is set to, for example, 100 KeV, which is reduced as compared to the acceleration voltage at the time of forming the third p-type impurity layer 311c. As a result, as shown in FIG. 2D, a fourth p-type impurity layer 311d is formed on the third p-type impurity layer 311c. Thereafter, the resist 50 is removed.

The first p-type impurity layer 311a to the fourth p-type impurity layer 311d formed in the steps shown in FIG. 2A to FIG. 2D above correspond to the first region 311 in a state before diffusion. In the present embodiment, as described above, the boron ions are injected multiple times while changing the dose amount of the boron ions and the acceleration voltage, so that the impurity layers as a base of the first region 311 are formed.

Figure 2E:
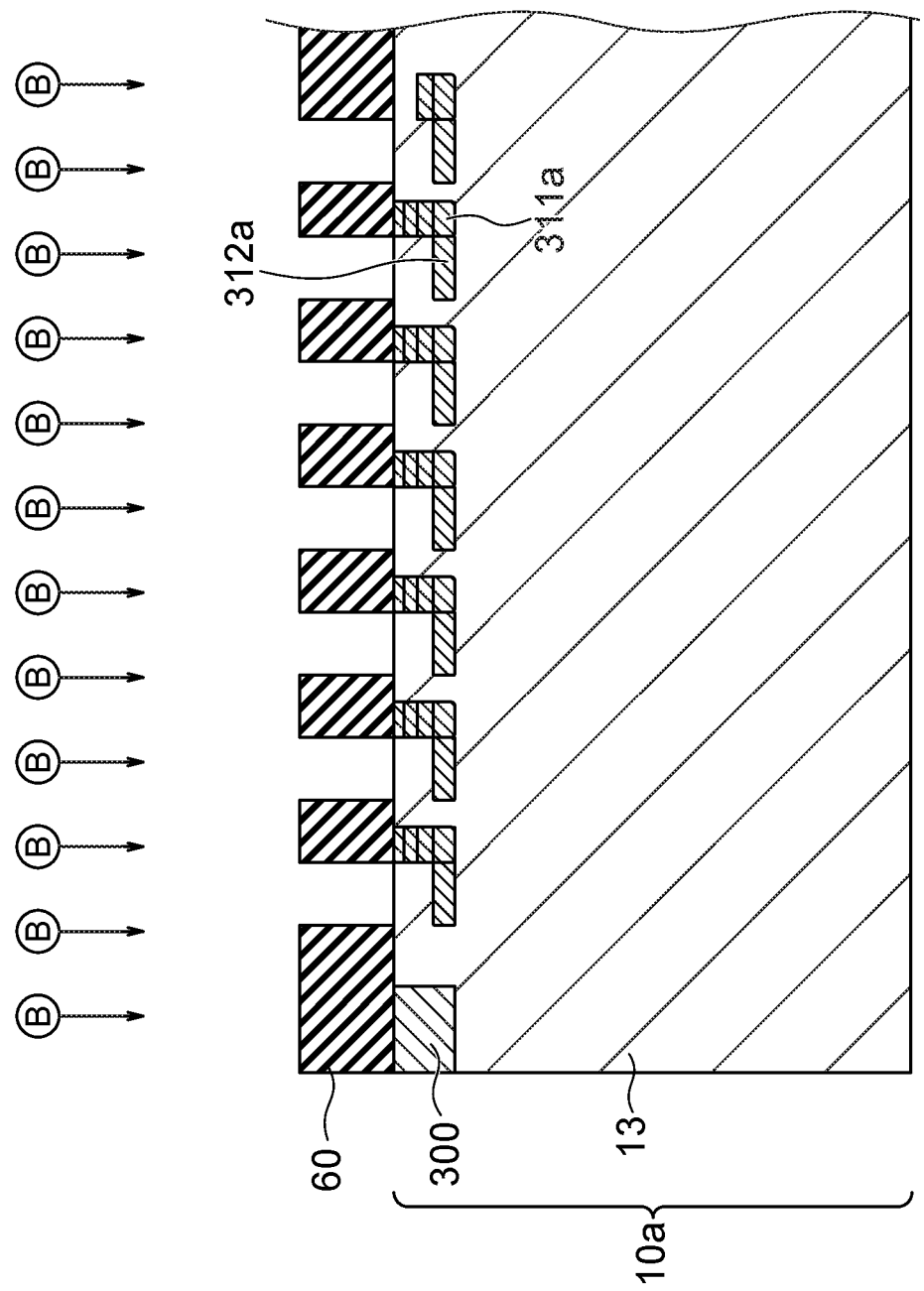
FIG. 2E is a cross-sectional view showing a step of forming a fifth p-type impurity layer.

Next, as shown in FIG. 2E, a resist 60 is formed on the front face of the semiconductor substrate 10a. The resist 60 is patterned so as to open a portion where the second region 312 is formed. Then, the resist 60 is irradiated with boron (B) ions from above. At this time, the dose amount of the boron ions and the acceleration voltage are respectively set to $1 \times 10^{13}$ cm$^{-2}$ and 3.5 MeV, which are the same forming conditions as those of the first p-type impurity layer 311a. As a result, as shown in FIG. 2E, a fifth p-type impurity layer 312a is formed adjacent to the first p-type impurity layer 311a. The fifth p-type impurity layer 312a corresponds to the second region 312 in a state before diffusion. Thereafter, the resist 60 is removed.

Note that in the present embodiment, the step of forming the first p-type impurity layer 311a to the fourth p-type impurity layer 311d and the step of forming the fifth p-type impurity layer 312a are continuously performed, but these steps may not be continuously performed. Further, in the present embodiment, the fifth p-type impurity layer 312a is formed after forming the first p-type impurity layer 311a to the fourth p-type impurity layer 311d, but may be previously formed.

Figure 2F:
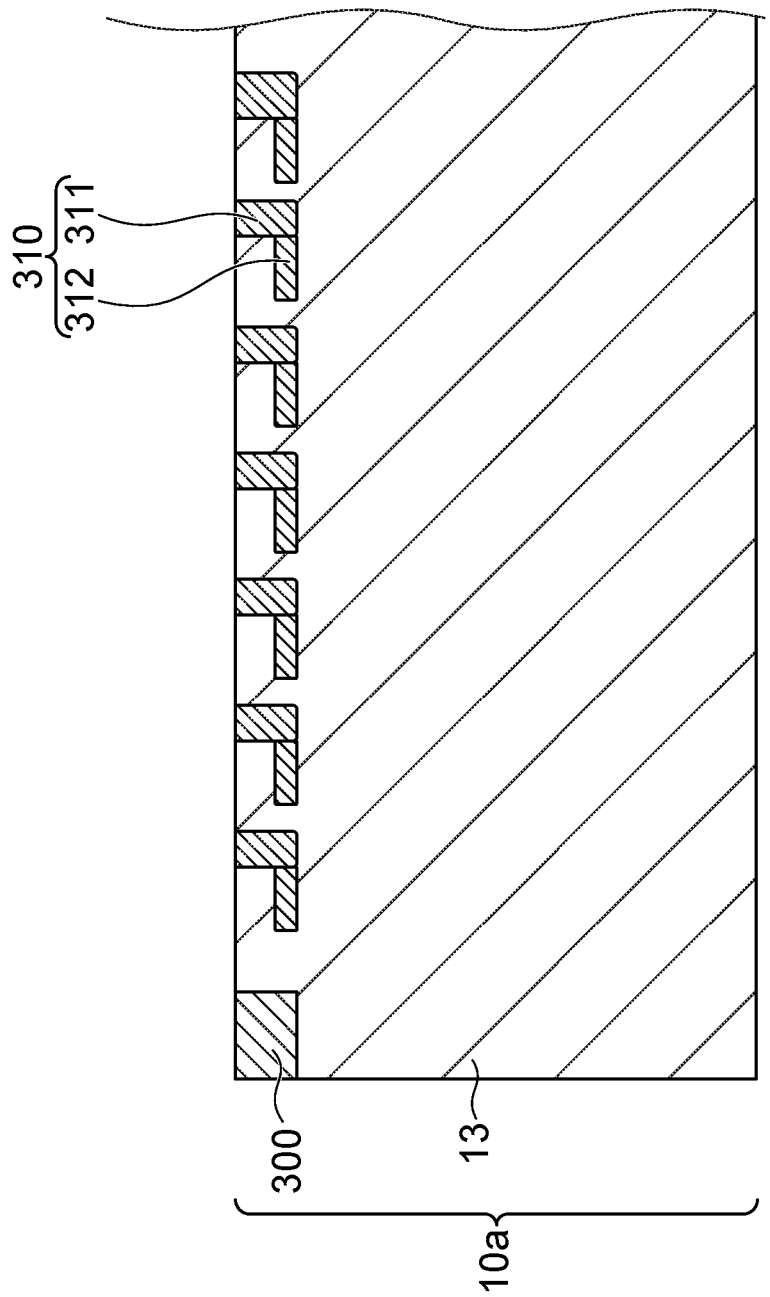
FIG. 2F is a cross-sectional view showing a step of heat treatment of each p-type impurity layer.

The first p-type impurity layer 311a to the fifth p-type impurity layer 312a formed as described above are subjected to heat treatment. As a result, as shown in FIG. 2F, the boron of each p-type impurity layer becomes active so that the first region 311 and the second region 312 are formed. At this time, the diffusion of the boron is suppressed by performing a low-temperature heat treatment at or lower than 1000° C. In this manner, the shape of the cross-section of the first region 311 and the second region 312 that are perpendicular to the semiconductor substrate 10 can be formed in a rectangle with round corners.

Next, the cell region 20 is formed. Here, the p-type base layer 21 and the n-type emitter layer 24 are formed by ion injection, for example. Further, a trench extending through the p-type base layer 21 and terminating in the n-type emitter layer 24 is formed by RIE (Reactive Ion Etching). The gate insulation film 23 and the gate electrode 22 are sequentially formed inside the trench by CVD (Chemical Vapor Deposition).

Figure 2G:
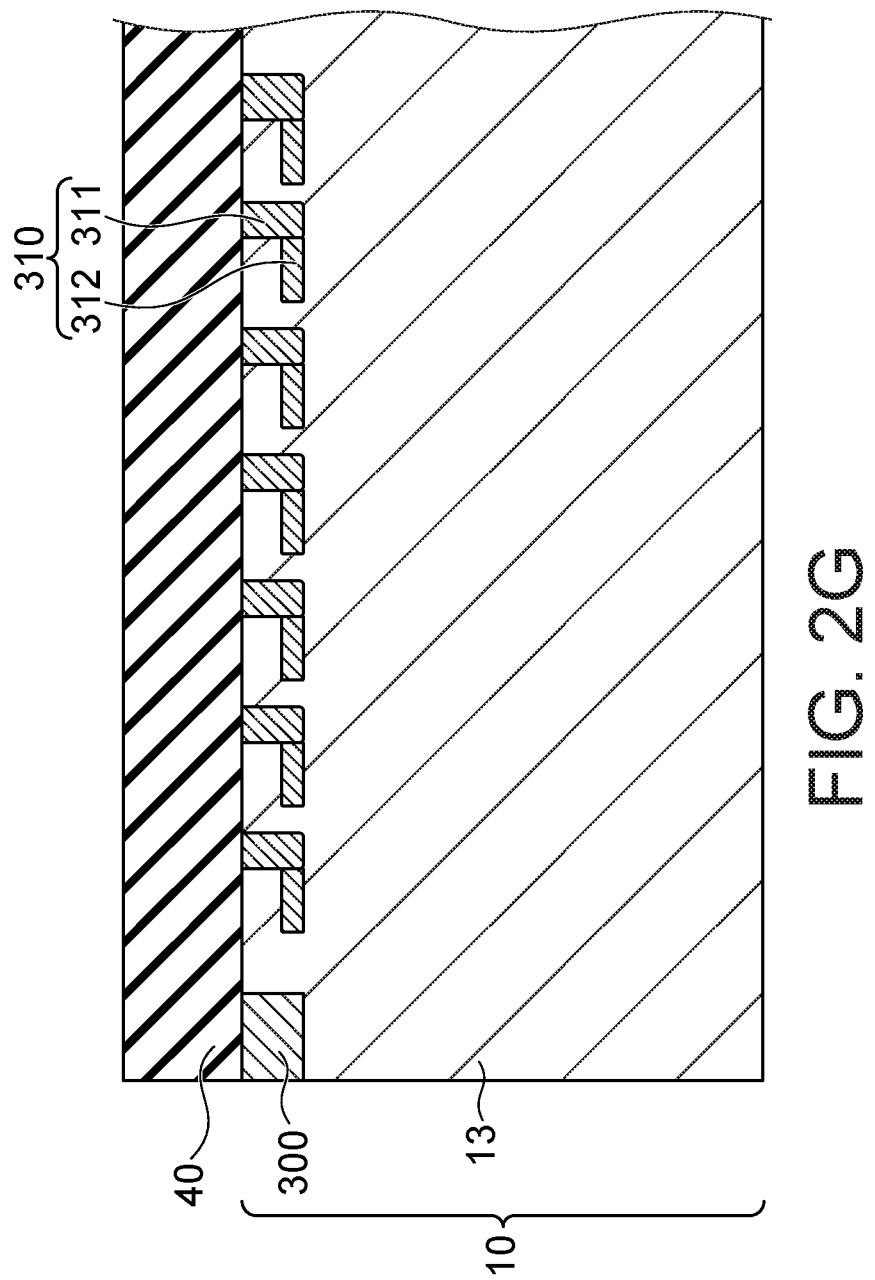
FIG. 2G is a cross-sectional view showing a step of forming an inter layer dielectric.

Then, as shown in FIG. 2G, the inter layer dielectric 40 is formed on the front face of the semiconductor substrate 10a where the guard ring layer 310 is formed.

Figure 2H:
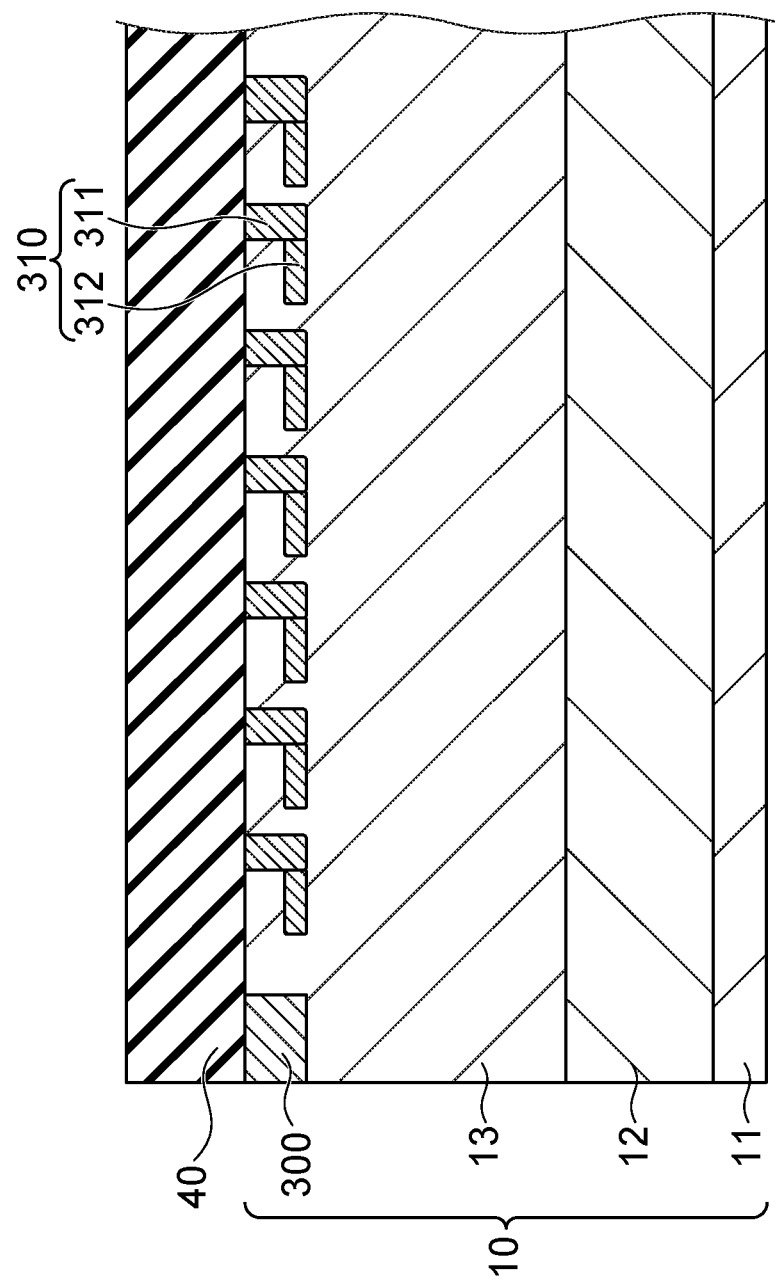
FIG. 2H is a cross-sectional view showing a step of forming an n-type buffer layer and a p-type collector layer.

Finally, as shown in FIG. 2H, the n-type buffer layer 12 and the p-type collector layer 11 are sequentially formed on the entire back face of the semiconductor substrate 10a. The n-type buffer layer 12 can be formed, for example, by annealing with phosphorus (P) ions injected into the back face side of the semiconductor substrate 10a. Meanwhile, the p-type collector layer 11 can be formed by annealing with boron ions injected into the back face side of the semiconductor substrate 10a. Note that the p-type collector layer 11 may not be formed in the termination region 30.

Here, semiconductor devices according to comparative examples that are compared with the above-described semiconductor device 1 according to the first embodiment will be described.

Figure 3:
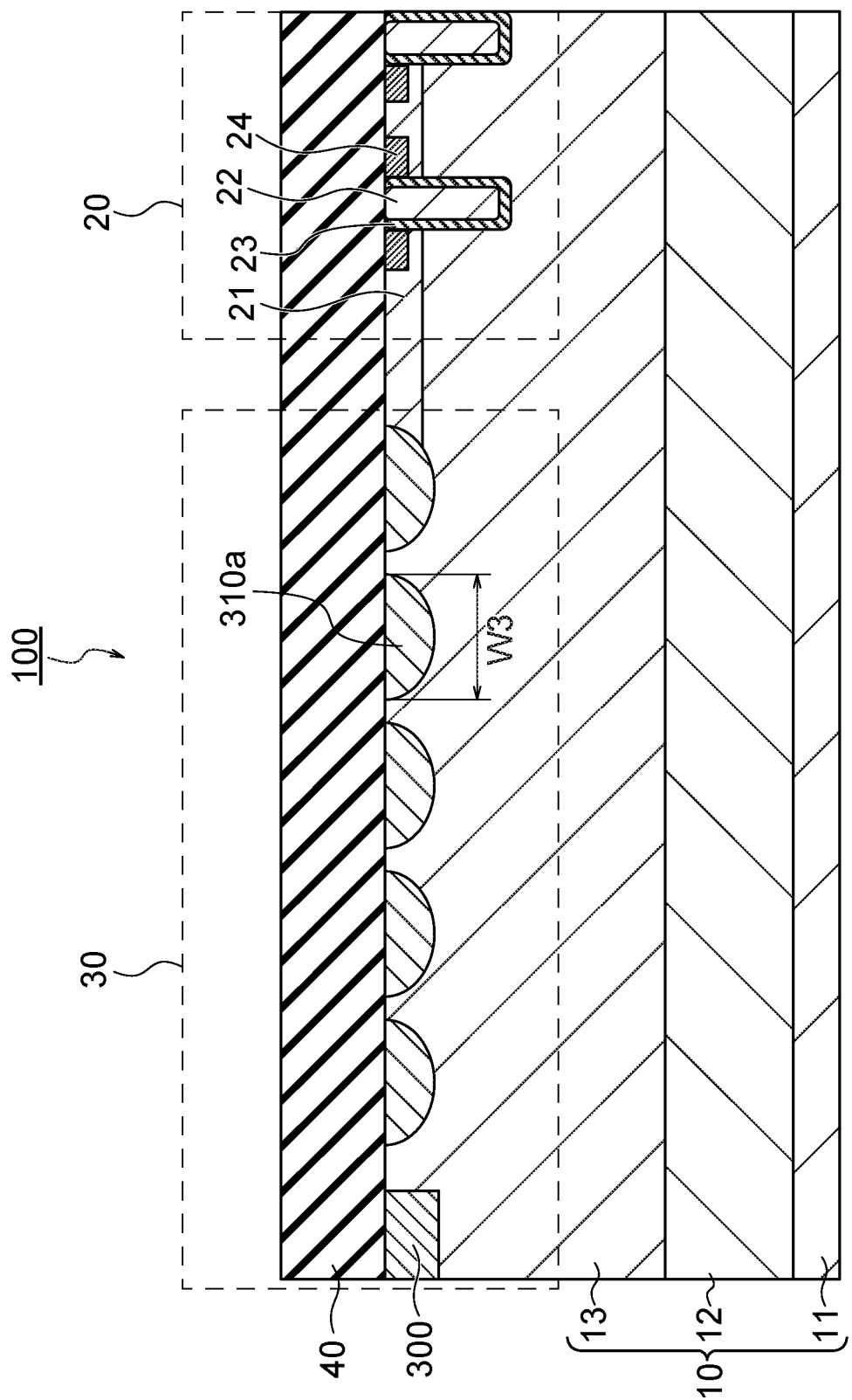
FIG. 3 is a cross-sectional view showing the structure of a semiconductor device according to a first comparative example.

FIG. 3 is a cross-sectional view showing the structure of a semiconductor device according to a first comparative example. In the present comparative example, the same constituent elements as those of the semiconductor device 1 according to the first embodiment are assigned the same reference numerals and the detailed descriptions will be omitted.

In a semiconductor device 100 according to the present comparative example, the cross-sectional shape of the guard ring layer of the termination region 30 differs from that of the first embodiment. In the present comparative example, the curvature of a guard ring layer 310a is round.

The guard ring layer 310a is a wide p-type diffusion layer that is deep from the front face of the semiconductor substrate 10, by subjecting the boron injected into the front face of the semiconductor substrate 10 to the heat treatment at a high temperature and for a long duration. In other words, the cross-section of the guard ring layer 310a is in a shape closer to a semi-circular shape. However, a diffusion layer having a width W3 that is wide as in the guard ring layer 310a is a factor of lengthening the termination region 30. Therefore, it is difficult to narrow the lateral width of the termination region 30.

Figure 4:
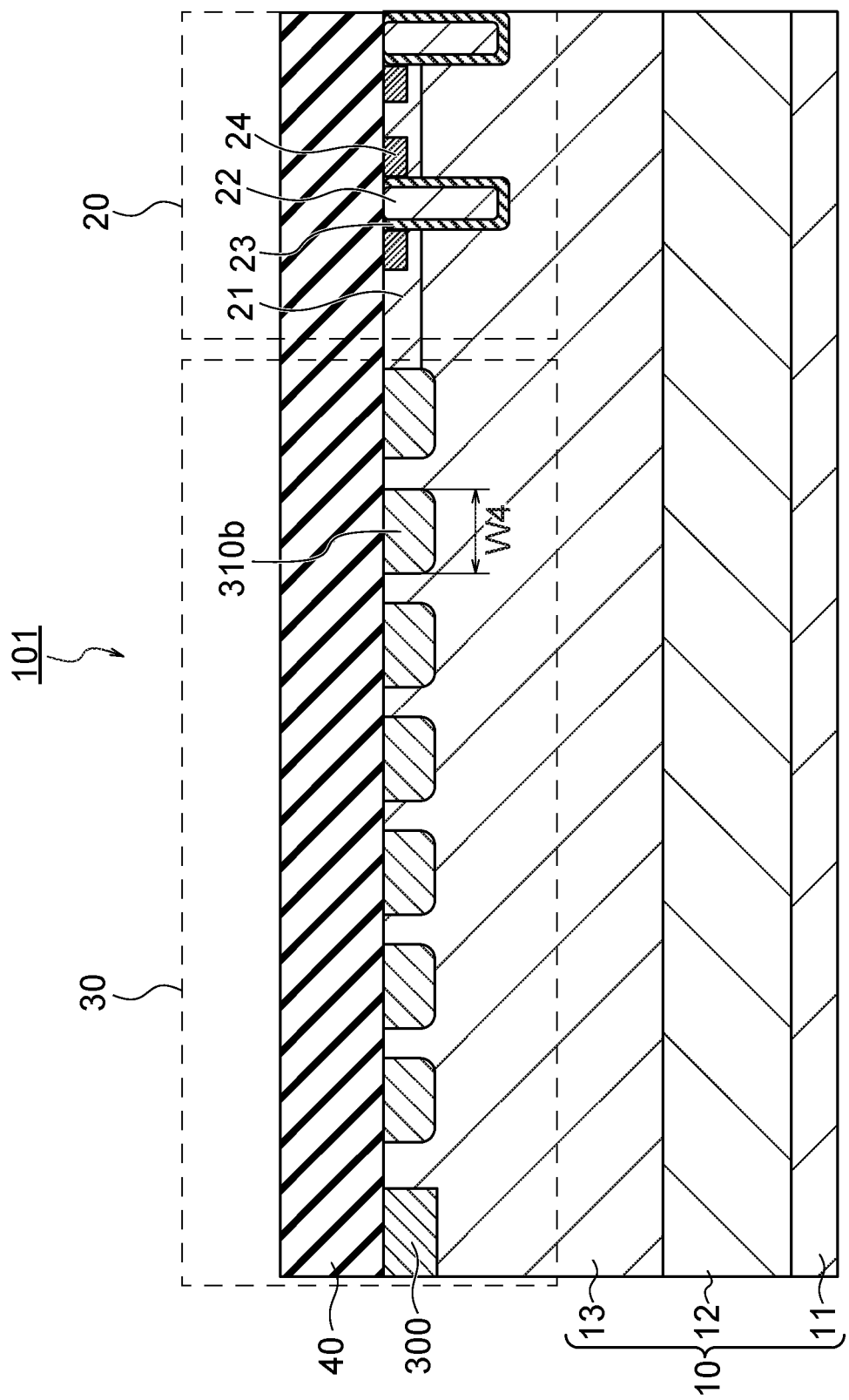
FIG. 4 is a cross-sectional view showing the structure of a semiconductor device according to a second comparative example.

FIG. 4 is a cross-sectional view showing the structure of a semiconductor device according to a second comparative example. In the present comparative example also, the same constituent elements as those of the semiconductor device 1 according to the first embodiment are assigned the same reference numerals and the detailed descriptions will be omitted.

In a semiconductor device 101 according to the present comparative example, a guard ring layer 310b of the termination region 30 has a cross-sectional shape closer to a rectangular shape. For the guard ring layer 310b, the diffusion temperature is set low at 1000° C. or lower to suppress the widening in the lateral direction. In this manner, a width W4 of the guard ring layer 310b is narrower than the width W3 of the above-described guard ring layer 310a of the first comparative example. Thus, the size of the termination region 30 can be reduced.

However, in the guard ring layer 310b, the curvature of the corner in the bottom portion is smaller than that of the guard ring layer 310a of the first comparative example. Therefore, the electric field concentrates near the corner, which decreases the breakdown voltage.

In contrast, the guard ring layer 310 according to the present embodiment is formed by a low-temperature heat treatment similarly to the second comparative example. Therefore, the electric field could concentrate in the corner portion of the first region 311.

However, in the guard ring layer 310, the second region 312 in which the concentration of the p-type impurity is lower than that of the first region 311 extends from the corner portion of the first region 311. With the second region 312, the concentration of the electric field in the corner portion of the first region 311 can be mitigated.

Figure 5:
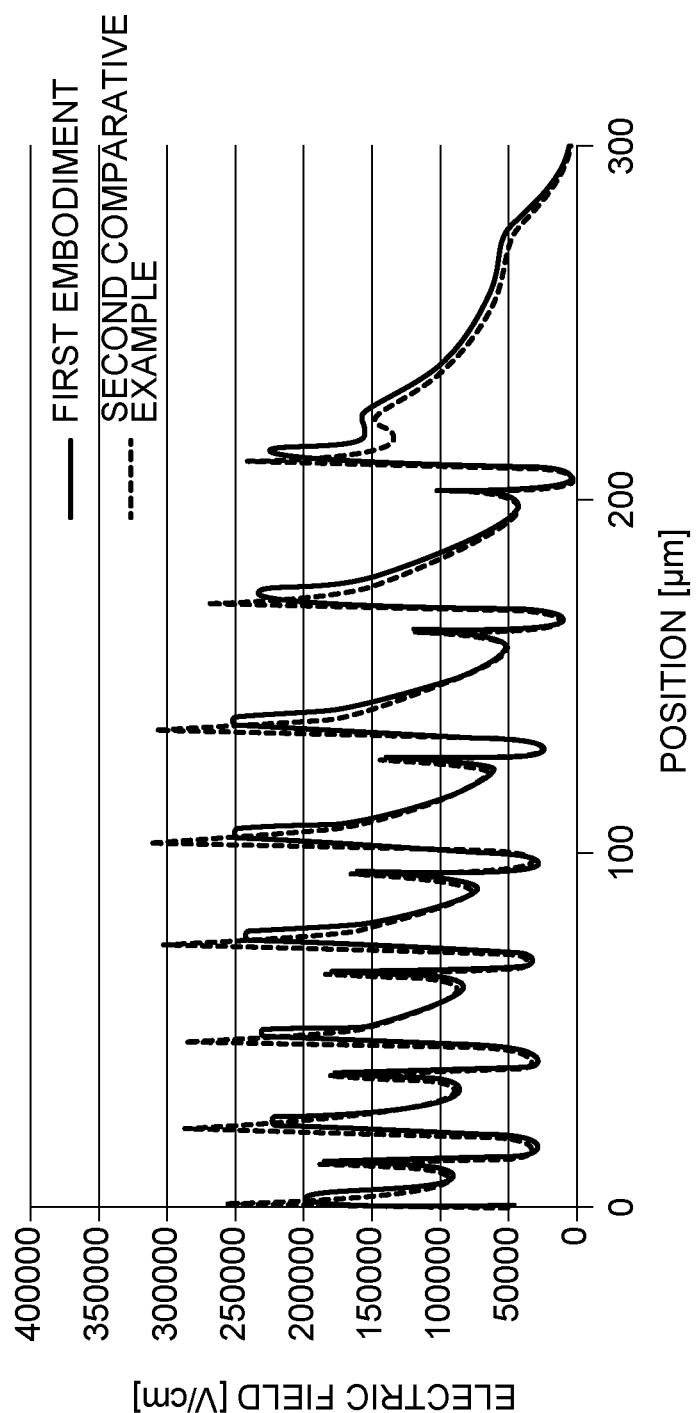
FIG. 5 is a graph showing an example of simulation results of an electric field distribution in a termination region.

FIG. 5 is a graph showing an example of simulation results of an electric field distribution in the termination region 30 of the present embodiment and the second comparative example. In FIG. 5, the lateral axis represents the position of the termination region 30 in the lateral direction when the boundary between the cell region 20 and the termination region 30 is set as a reference. The longitudinal axis represents the electric field on the front face of the semiconductor substrate 10 in the termination region 30.

According to the simulation results shown in FIG. 5, the present embodiment can suppress the electric field in the termination region 30 as compared to the second comparative example. Thus, the breakdown voltage improves so that the increase in the width of the termination region 30 can be suppressed.

Figure 6:
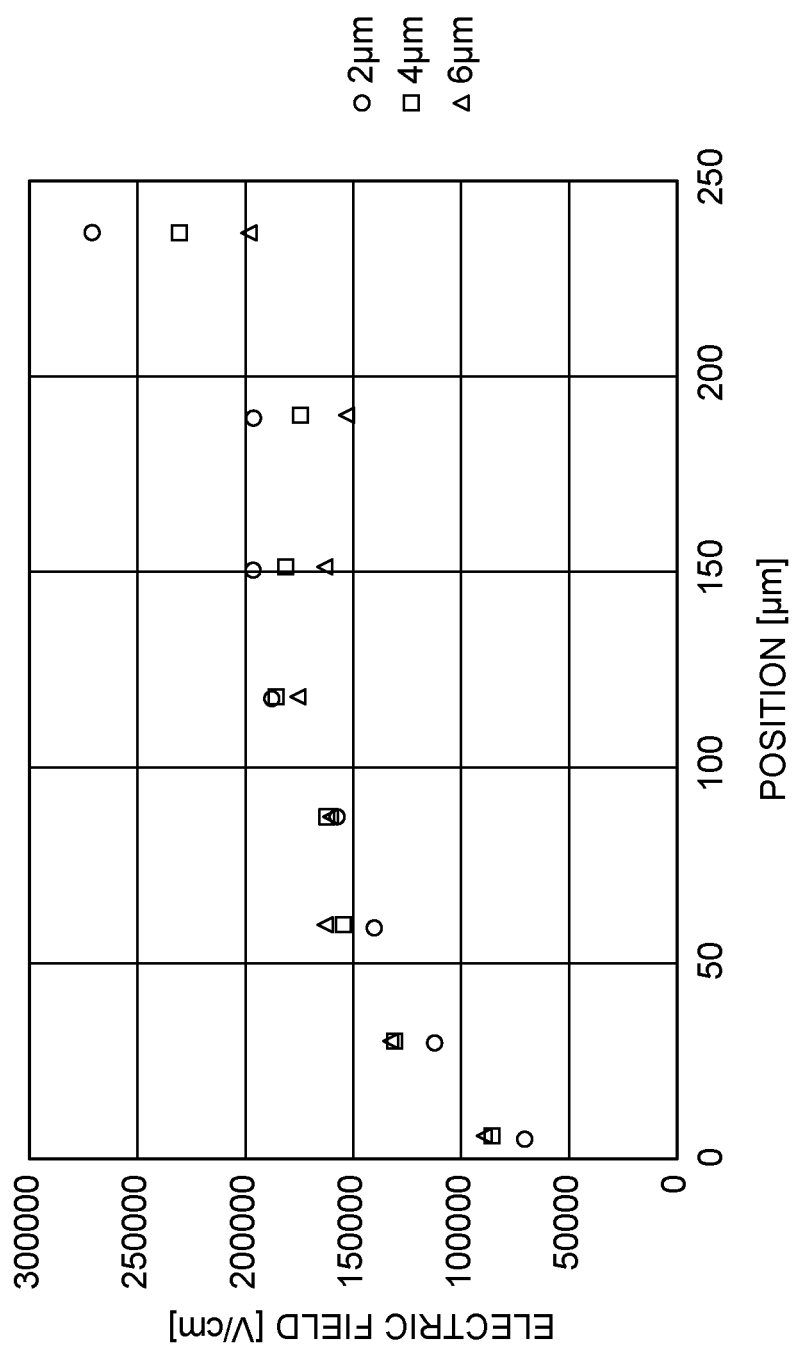
FIG. 6 is a graph showing an example of simulation results of the electric field distribution in the termination region when a width of a second region is changed.

FIG. 6 is a graph showing an example of simulation results of the electric field distribution in the termination region 30 when the width W2 of the second region 312 is changed. In FIG. 6, the lateral axis represents the position of the termination region 30 in the lateral direction when the boundary between the cell region 20 and the termination region 30 is set as a reference. The longitudinal axis represents the electric field on the front face of the semiconductor substrate 10 in the termination region 30.

FIG. 6 shows the simulation results of the electric field distribution when the width W2 of the second region 312 is 2 μm, 4 μm, and 6 μm. Note that in FIG. 6, only the peak values of the electric field are plotted.

According to the simulation results shown in FIG. 6, as the width W2 of the second region 312 increases, the electric field on the front face of the semiconductor substrate 10 decreases. However, when the width W2 is increased, the termination region 30 is enlarged. Therefore, the sum of the width W1 of the first region 311 and the width W2 of the second region 312 is preferably the same or smaller than the width W4 of the guard ring layer 310b of the second comparative example.

According to the present embodiment described above, with the first region 311 and the second region 312 having a rectangular cross-sectional shape, the decrease in the breakdown voltage can be avoided while reducing the area of the termination region.

Note that in the present embodiment, the concentration of the p-type impurity in the second region 312 is uniform. However, a gradient of concentration may be present in the second region 312. The gradient of concentration of the p-type impurity layer can be formed by changing the dose amount of the boron ions, for example, in forming the second region 312. For example, in the second region 312, the concentration of the p-type impurity may be reduced from an inner end portion that is a portion contacting the first region 311 toward an outer end portion that is a portion farthest from the first region 311. In this manner, the second region 312 has a gradient of concentration of the p-type impurity layer, so that the electric field in the termination region 30 can be further mitigated.

Second Embodiment

Figure 7:
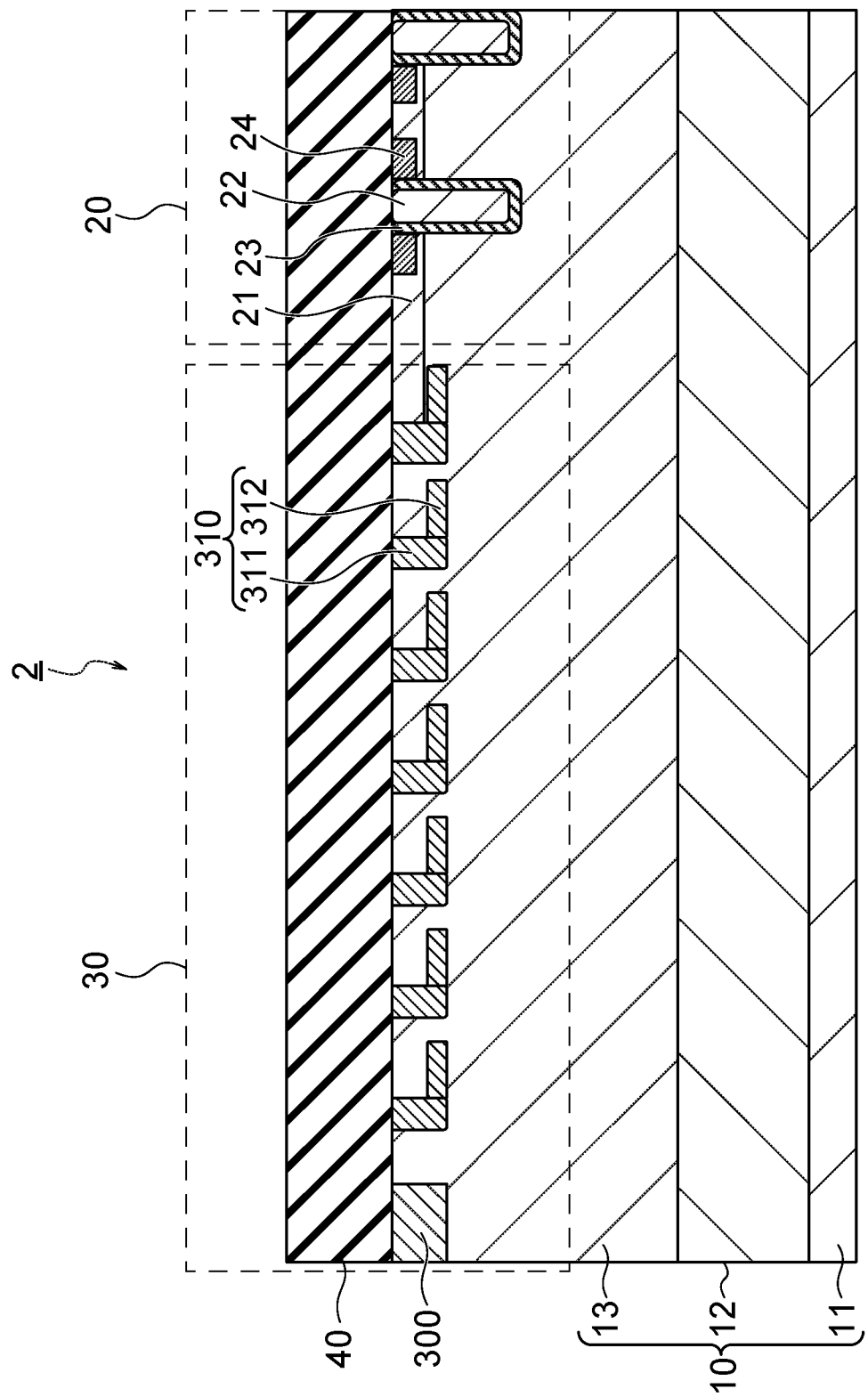
FIG. 7 is a cross-sectional view showing the schematic structure of a semiconductor device according to a second embodiment.

FIG. 7 is a cross-sectional view showing the schematic structure of a semiconductor device according to a second embodiment. In FIG. 7, the same constituent elements as those of the above-described semiconductor device 1 according to the first embodiment are assigned the same reference numerals and the detailed descriptions will be omitted. In the above-described semiconductor device 1 according to the first embodiment, the second region 312 is disposed on the outer side of the first region 311, namely, on the side of the EQPR layer 300. Meanwhile, in a semiconductor device 2 according to the present embodiment, as shown in FIG. 7, the second region 312 is disposed on the inner side of the first region 311, namely, on the side of the cell region 20.

The semiconductor device 2 according to the present embodiment can also be manufactured through the same manufacturing step as that of the semiconductor device 1 according to the first embodiment described in the first embodiment. The second region 312 can be formed by changing an opening pattern of the resist 60 (see FIG. 2E) for injection of the boron ions so as to open a portion on the inner side of the first region 311.

Figure 8:
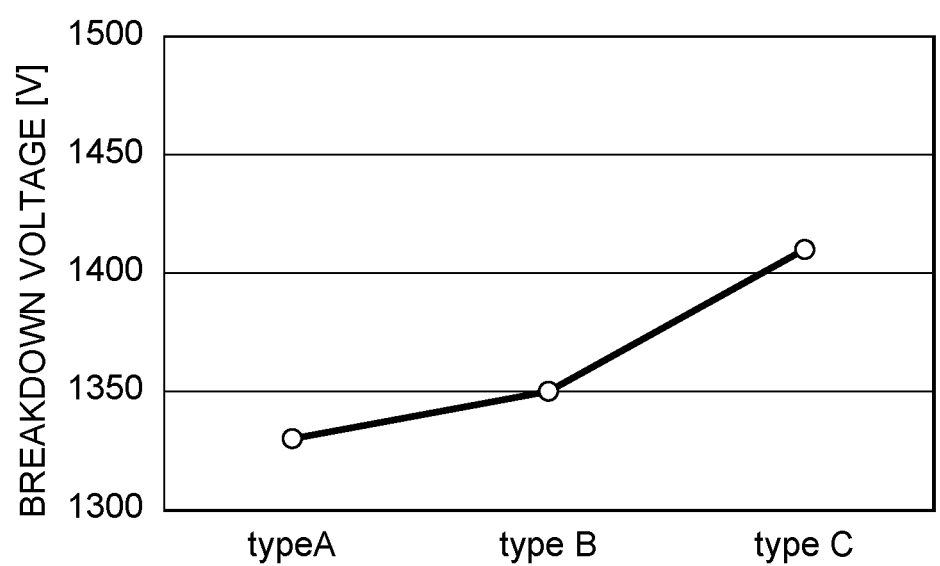
FIG. 8 is a view showing an example of simulation results of a breakdown voltage.

FIG. 8 is a view showing an example of simulation results of a breakdown voltage of the second comparative example, the first embodiment, and the second embodiment. In FIG. 8, a type A, a type B, and a type C correspond to the second comparative example, the first embodiment, and the second embodiment, respectively.

FIG. 8 shows the breakdown voltage between the collector and the emitter under the simulation condition that an external charge of $-5 \times 10^{11}$ cm$^{-2}$ is accumulated on the front face of the semiconductor substrate 10 in the termination region 30. When a negative charge is present on the front face of the semiconductor substrate 10, the electric field extends, and thus, the guard ring layer 310 cannot bear the electric potential in the lateral direction in some cases. In such a case, the breakdown voltage decreases.

In the present embodiment, the electric field on the front face of the semiconductor substrate 10 in the termination region 30 can be mitigated by forming the cross-sectional shape of the guard ring layer 310 in a rectangular shape. In this manner, the robustness against charge can be improved. In addition, in the present embodiment, the second region 312 is formed so as to project from the first region 311 toward the side of the cell region 20. In this manner, a space where the electric field extends on the front face of the semiconductor substrate 10 can be secured, so that the robustness against charge can be improved.

Third Embodiment

Figure 9:
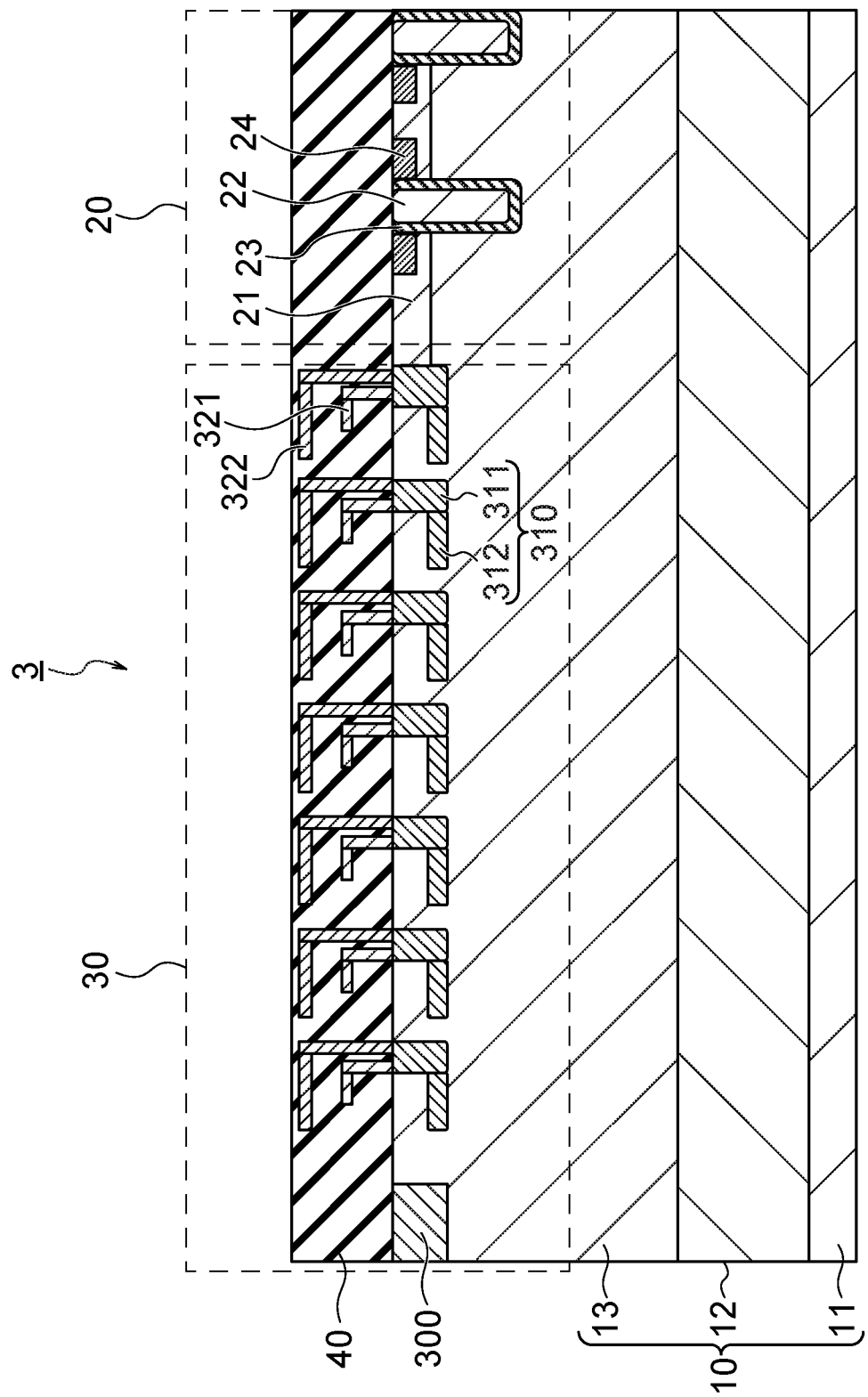
FIG. 9 is a cross-sectional view showing the schematic structure of a semiconductor device according to a third embodiment.

FIG. 9 is a cross-sectional view showing the schematic structure of a semiconductor device according to a third embodiment. In FIG. 9, the same constituent elements as those of the above-described semiconductor device 1 according to the first embodiment are assigned the same reference numerals and the detailed descriptions will be omitted.

In a semiconductor device 3 according to the present embodiment, in addition to the constituent elements of the above-described semiconductor device 1 according to the first embodiment, a first field plate 321 and a second field plate 322 are provided inside the inter layer dielectric 40.

The first field plate 321 opposes each of the guard ring layers 310 via the inter layer dielectric 40. The first field plate 321 is formed of metal such as tungsten (W), for example. The first field plate 321 is connected to the first region 311.

The second field plate 322 is stacked on the first field plate 321 via the inter layer dielectric 40. The second field plate 322 is formed of metal such as aluminum (Al), for example.

The second field plate 322 is also connected to the first region 311 of each of the guard ring layers 310. Further, the second field plate 322 is longer than the first field plate 321. In addition, the second field plate 322 is thicker than the first field plate 321.

Note that in the present embodiment, each of the guard ring layers 310 is provided with the first field plate 321 and the second field plate 322, but the number of layers of the field plates may differ in each guard ring layer 310. Further, the first field plate 321 may contact the first region 311 of each of the guard ring layers 310 and further, the second field plate 322 may contact the first field plate 321.

The first field plate 321 and the second field plate 322 are formed subsequently to the step of forming the guard ring layer 310 and the step of forming the cell region 20. Here, with reference to FIG. 10A to FIG. 10G, the manufacturing method for the first field plate 321 and the second field plate 322 will be described.

Figure 10A:
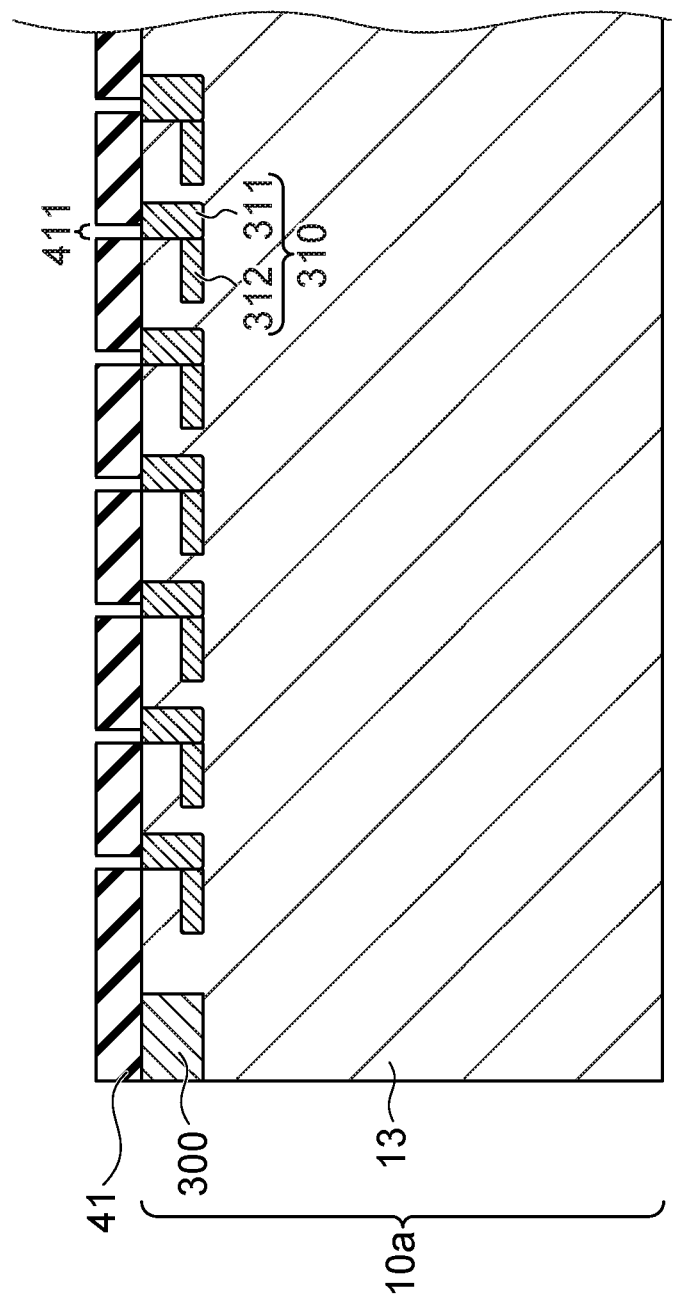
FIG. 10A is a cross-sectional view showing a step of forming a first opening in a first inter layer dielectric.

First, as shown in FIG. 10A, a first inter layer dielectric 41 is formed on the front face of the semiconductor substrate 10a where the guard ring layer 310 is formed. The first inter layer dielectric 41 is a portion as a lower layer of the inter layer dielectric 40. The thickness of the first inter layer dielectric 41 is 1.1 µm, for example. Subsequently, a first opening 411 extending through the first inter layer dielectric 41 is formed so as to expose a part of each first region 311. The first opening 411 is formed in a portion where the first field plate 321 is formed.

Figure 10B:
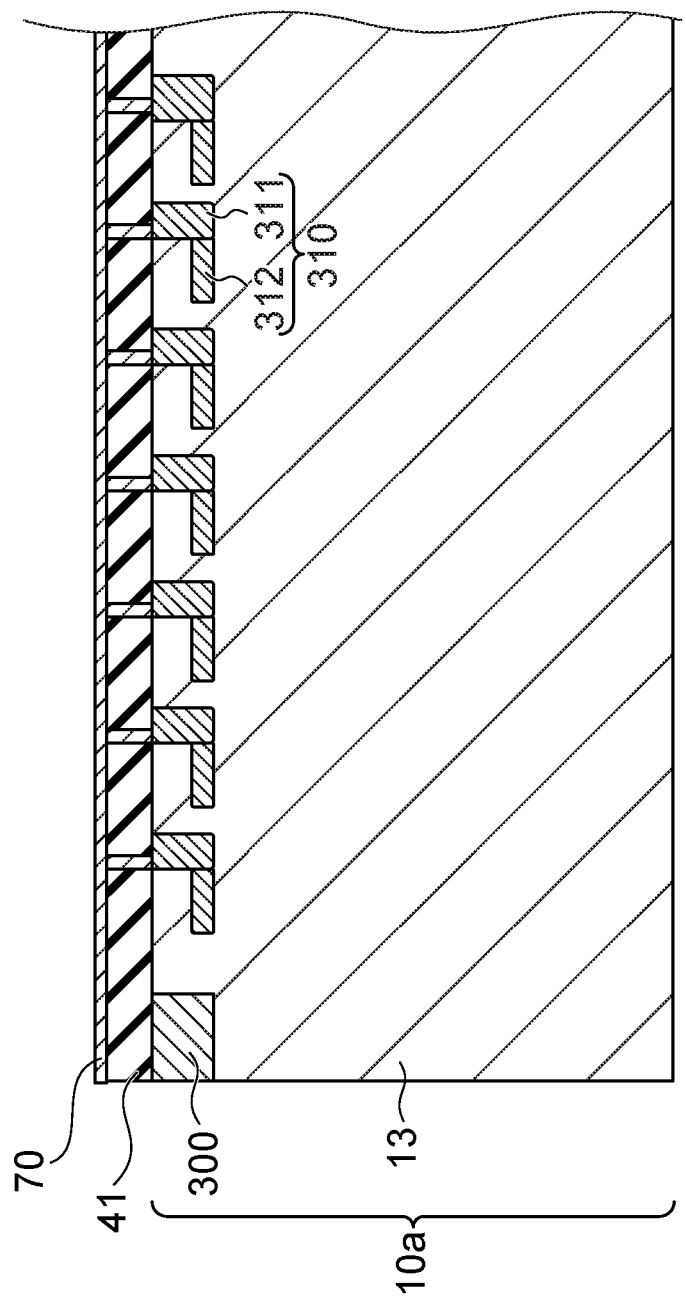
FIG. 10B is a cross-sectional view showing a step of forming a first conductive film.

Next, as shown in FIG. 10B, a first conductive film 70 is formed on the first inter layer dielectric 41. The first conductive film 70 is a tungsten film formed by CVD, for example. The film thickness of the first conductive film 70 is 300 nm, for example. In this step, the first opening 411 is filled with the first conductive film 70. The opening width of the first opening 411 is narrowed as much as possible, so that the surface of the first conductive film 70 can be made almost flat.

Figure 10C:
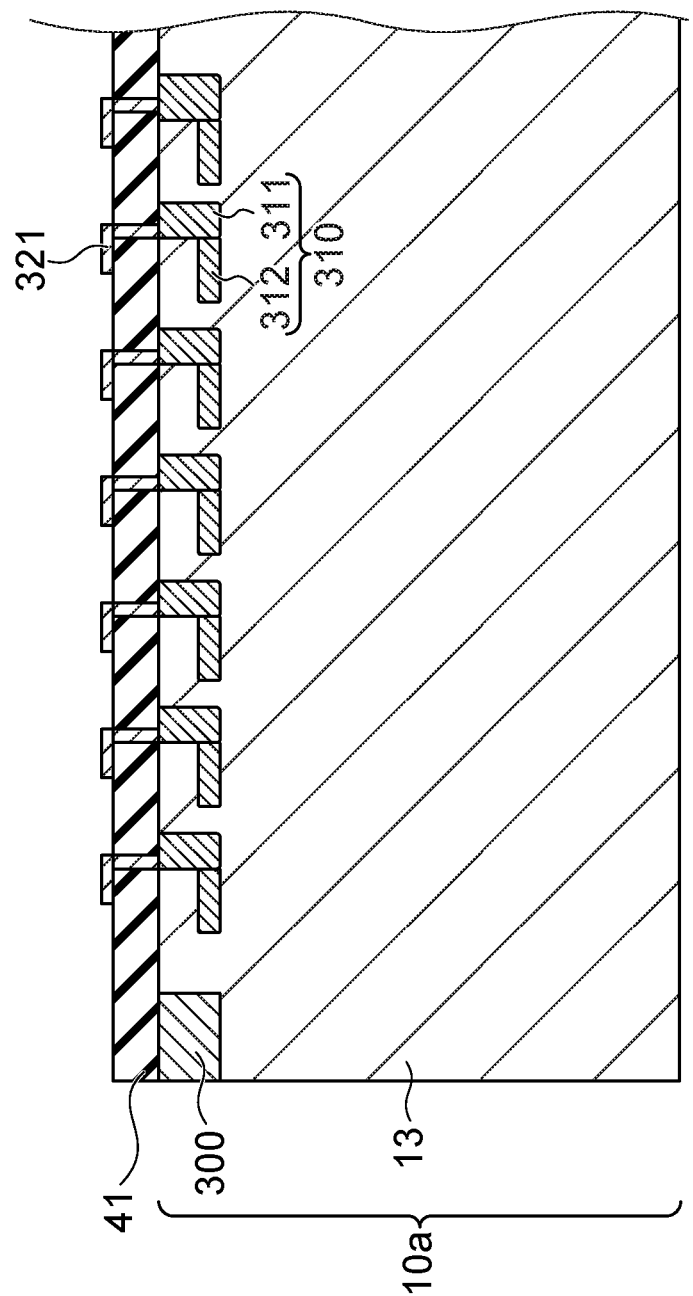
FIG. 10C is a cross-sectional view showing a step of removing a part of the first conductive film.

Then, as shown in FIG. 10C, an unnecessary portion of the first conductive film 70 is removed by RIE. In this manner, the first field plate 321 is completed. Further, the first conductive film 70 filled in the first opening 411 functions as a first contact plug that electrically connects the first field plate 321 to the first region 311.

Figure 10D:
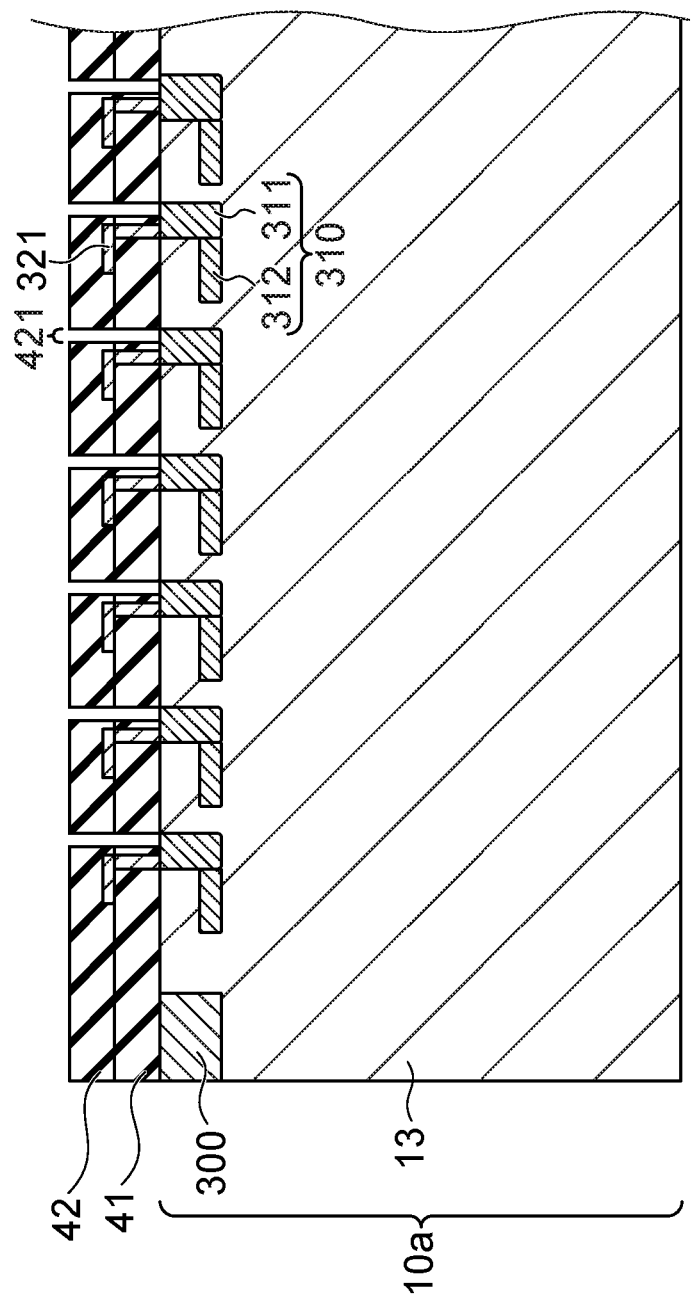
FIG. 10D is a cross-sectional view showing a step of forming a second opening in a second inter layer dielectric.

Next, as shown in FIG. 10D, a second inter layer dielectric 42 is formed on the first inter layer dielectric 41 so as to cover the first field plate 321. The second inter layer dielectric 42 is a portion as an intermediate layer of the inter layer dielectric 40. The thickness of the second inter layer dielectric 42 only needs to be greater than the thickness of the first inter layer dielectric 41 and is 3 µm, for example. Subsequently, a second opening 421 extending through the first inter layer dielectric 41 and the second inter layer dielectric 42 is formed so as to expose a part of the first region 311. The second opening 421 is formed in a portion where the second field plate 322 is formed.

Figure 10E:
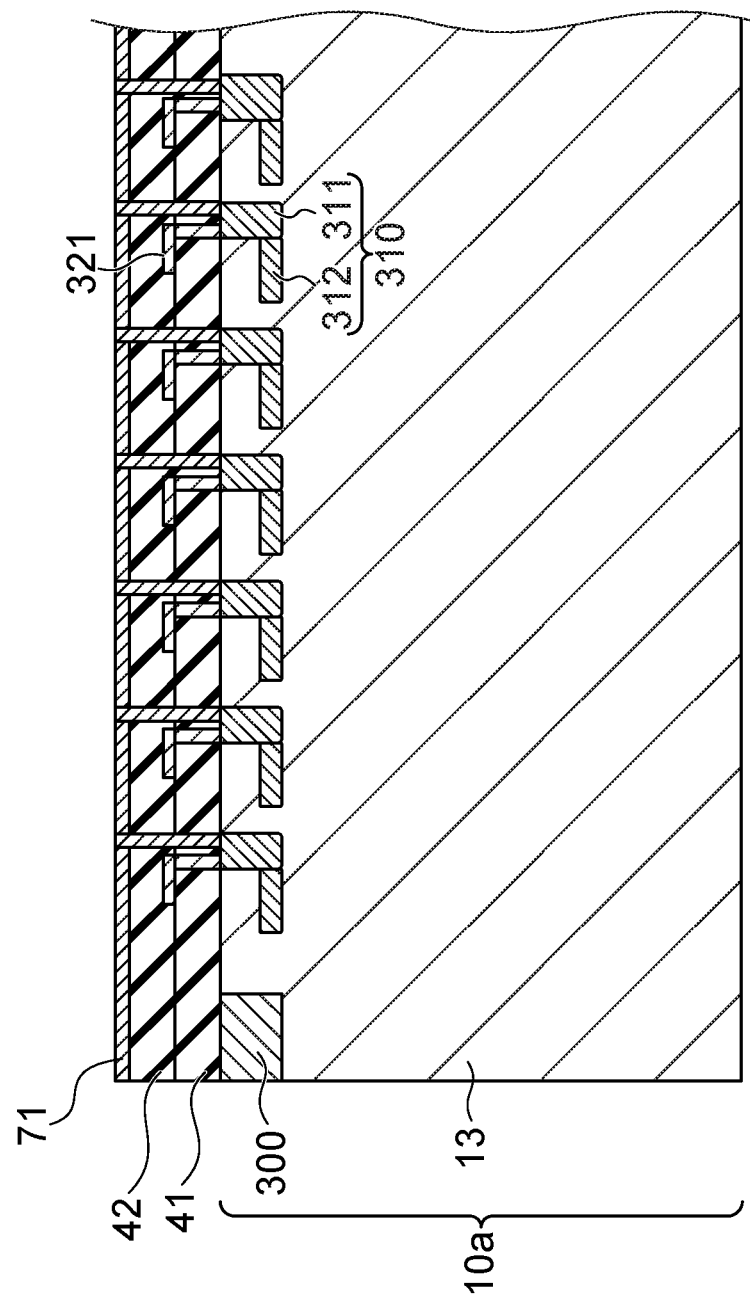
FIG. 10E is a cross-sectional view showing a step of forming a second conductive film.

Next, as shown in FIG. 10E, a second conductive film 71 is formed on the second inter layer dielectric 42. The second conductive film 71 is an aluminum film formed by PVD (Physical Vapor Deposition), for example. The film thickness of the second conductive film 71 is 4 µm, for example. In this step, the second opening 421 is filled with the second conductive film 71.

Figure 10F:
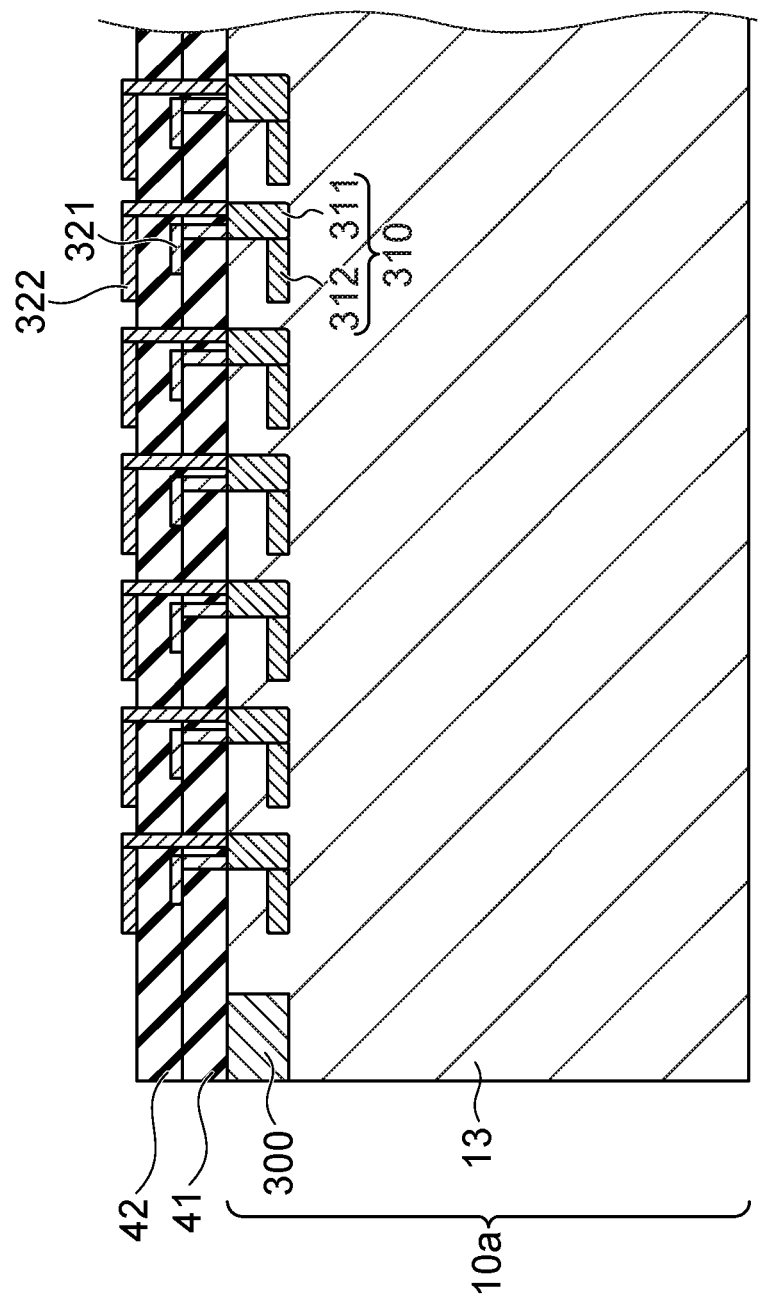
FIG. 10F is a cross-sectional view showing a step of removing a part of the second conductive film.

Then, as shown in FIG. 10F, an unnecessary portion of the second conductive film 71 is removed by RIE. In this manner, the second field plate 322 is completed. Further, the second conductive film 71 filled in the second opening 421 functions as a second contact plug that electrically connects the second field plate 322 to the first region 311.

Finally, as shown in FIG. 10G, a passivation film 43 is formed on the second inter layer dielectric 42 so as to cover the second field plate 322. The passivation film 43 is a portion as an upper layer of the inter layer dielectric 40. The passivation film 43 includes, for example, a stacked film in which a resin film of polyimide or the like, a semi-insulation film or an insulation film, and the like are stacked. Thereafter, similarly to the first embodiment, the n-type buffer layer 12 and the p-type collector layer 11 are sequentially formed on the entire back face of the semiconductor substrate 10a.

According to the present embodiment described above, the first field plate 321 and the second field plate 322 are provided in the termination region 30. Therefore, the electric field on the front face of the semiconductor substrate 10 in the termination region 30 can be mitigated.

(Modification 1)

Hereinafter, a modification of the first embodiment will be described with reference to FIG. 11A to FIG. 11H. In the present modification, the shape of the guard ring layer 310 differs from that of the first embodiment.

Figure 11A:
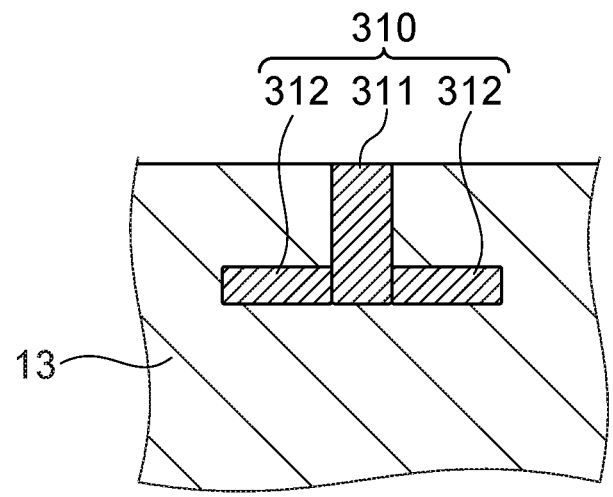
FIG. 11A is a cross-sectional view of a guard ring layer in which a second region extends on both sides of a first region.

In the guard ring layer 310 shown in FIG. 11A, the second region 312 extends on both sides of the first region 311. In this case, the width of the second region 312 does not need to be the same on both sides of the first region 311. The optimal width for each of the inner side and the outer side of the first region 311 only needs to be designed in accordance with the electric field distribution on the front face of the semiconductor substrate 10.

Figure 11B:
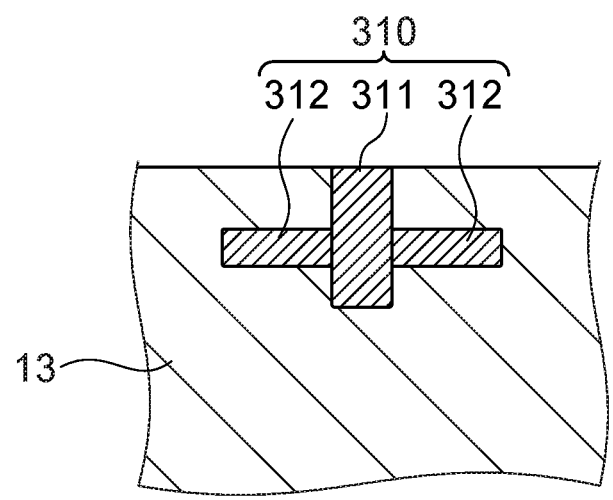
FIG. 11B is a cross-sectional view of the guard ring layer in which a bottom portion of the second region extending on both sides of the first region is disposed in a position shallower than a bottom portion of the first region.

In the guard ring layer 310 shown in FIG. 11B, the bottom portion of the second region 312 extending on both sides of the first region 311 is disposed in a position shallower than the bottom portion of the first region 311. In the guard ring layer 310 shown in FIG. 11C, the bottom portion of the second region 312 extending on the outer side of the first region 311 is disposed in a position shallower than the bottom portion of the first region 311. In the guard ring layer 310 shown in FIG. 11D, the bottom portion of the second region 312 extending on the inner side of the first region 311 is disposed in a position shallower than the bottom portion of the first region 311.

Figure 11C:
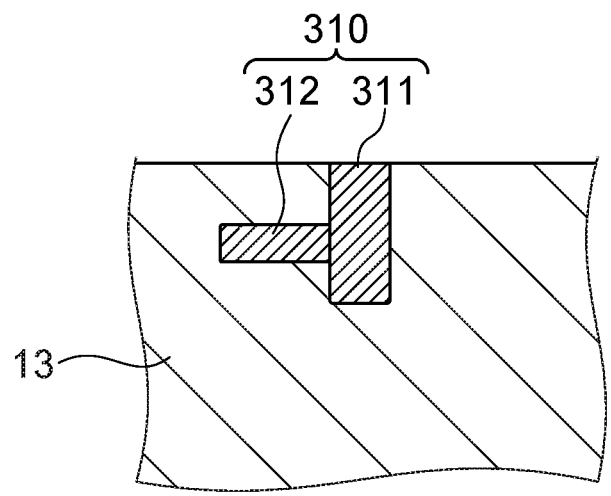
FIG. 11C is a cross-sectional view of the guard ring layer in which the bottom portion of the second region extending on an outer side of the first region is disposed in a position shallower than the bottom portion of the first region.
Figure 11D:
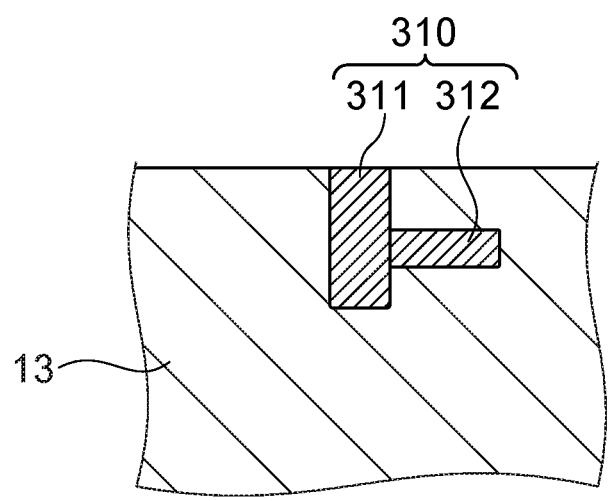
FIG. 11D is a cross-sectional view of the guard ring layer in which the bottom portion of the second region extending on an inner side of the first region is disposed in a position shallower than the bottom portion of the first region.

The positional relation of the bottom portions of the regions as shown in FIG. 11B to FIG. 11D can be embodied by adjusting the acceleration voltage of boron ions. Specifically, the acceleration voltage at the time of forming the first p-type impurity layer 311a (see FIG. 2A) corresponding to the bottom portion of the first region 311 is greater than the acceleration voltage at the time of forming the fifth p-type impurity layer 312a (see FIG. 2E) corresponding to the second region 312.

Figure 11E:
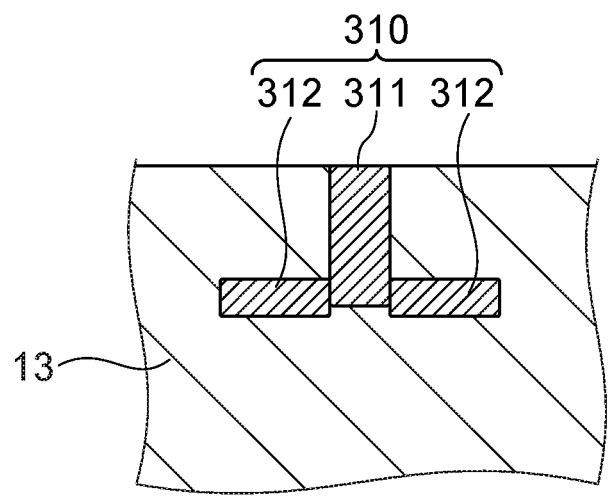
FIG. 11E is a cross-sectional view of the guard ring layer in which the bottom portion of the second region extending on both sides of the first region is disposed in a position deeper than the bottom portion of the first region.
Figure 11F:
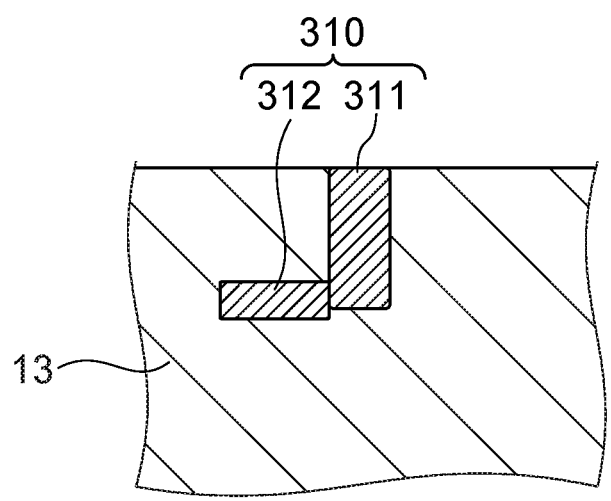
FIG. 11F is a cross-sectional view of the guard ring layer in which the bottom portion of the second region extending on the outer side of the first region is disposed in a position deeper than the bottom portion of the first region.
Figure 11G:
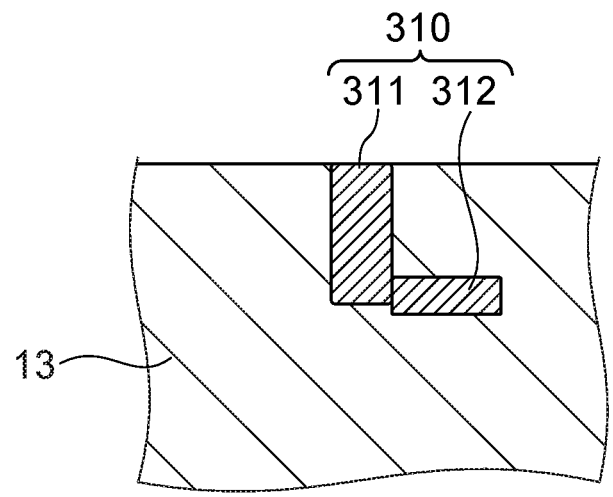
FIG. 11G is a cross-sectional view of the guard ring layer in which the bottom portion of the second region extending on the inner side of the first region is disposed in a position deeper than the bottom portion of the first region.
Figure 11H:
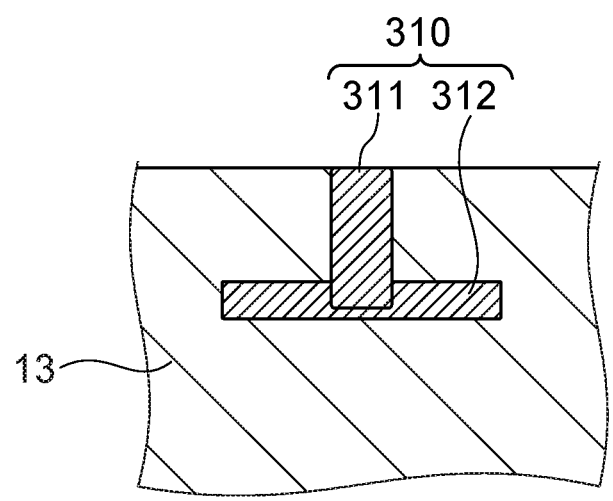
FIG. 11H is a cross-sectional view of the guard ring layer in which the second region extends on both sides of the first region and the bottom portion of the first region contacts the second region.

In the guard ring layer 310 shown in FIG. 11E, the bottom portion of the second region 312 extending on both sides of the first region 311 is disposed in a position deeper than the bottom portion of the first region 311. In the guard ring layer 310 shown in FIG. 11F, the bottom portion of the second region 312 extending on the outer side of the first region 311 is disposed in a position deeper than the bottom portion of the first region 311. In the guard ring layer 310 shown in FIG. 11G, the bottom portion of the second region 312 extending on the inner side of the first region 311 is disposed in a position deeper than the bottom portion of the first region 311. In the guard ring layer 310 shown in FIG. 11H, the second region 312 extends on both sides of the first region 311 and the bottom portion of the first region 311 contacts the second region 312.

The positional relation of the bottom portions of the regions as shown in FIG. 11E to FIG. 11H can also be embodied by adjusting the acceleration voltage of boron ions. Specifically, the acceleration voltage at the time of forming the first p-type impurity layer 311a is smaller than the acceleration voltage at the time of forming the fifth p-type impurity layer 312a.

In the present modification described above also, since each guard ring layer 310 has the second region 312, the decrease in the breakdown voltage can be avoided while reducing the area of the termination region.

Note that in the termination region 30, a plurality of guard ring layers 310 is formed, but not all of the guard ring layers 310 needs to be formed in the same shape. In the termination region 30, the shapes of the first region 311 and the second region 312 as shown in FIG. 11A to FIG. 11H described above may be mixed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A semiconductor device comprising:
a semiconductor substrate;
a cell region on a side of a first face of the semiconductor substrate; and
a termination region on an outer side of the cell region on the side of the first face of the semiconductor substrate,
wherein the termination region surrounds the cell region and includes a plurality of first diffusion layers containing a first conductivity type impurity,
wherein in a cross-section of the termination region in a first direction perpendicular to the first face, at least one of the plurality of first diffusion layers includes:
a first region extending in the first direction from the first face toward a second face of the semiconductor substrate, and
a second region extending in a second direction orthogonal to the first direction from the first region,
wherein a concentration of the first conductivity type impurity contained in the second region is lower than a concentration of the first conductivity type impurity contained in the first region, and
wherein a gradient of the concentration of the first conductivity type impurity is present in the second region.

2. The semiconductor device according to claim 1, wherein a width of a bottom portion of the at least one of the plurality of first diffusion layers is greater than a width of an upper portion, positioned on the side of the first face, of the at least one of the plurality of first diffusion layers.

3. The semiconductor device according to claim 1, wherein a first semiconductor layer of a second conductivity type is provided on the second region of the semiconductor substrate.

4. The semiconductor device according to claim 1, wherein in the second region, the concentration of the first conductivity type impurity is reduced from an inner end portion contacting the first region toward an outer end portion farthest from the first region.

5. The semiconductor device according to claim 1, wherein the second region extends on an outer side of the first region, an inner side of the first region, or both the outer and inner sides of the first region.

6. The semiconductor device according to claim 5, wherein a bottom portion of the second region is disposed in a position shallower or a position deeper than a bottom portion of the first region.

7. The semiconductor device according to claim 1, wherein the termination region further comprises a conductive layer opposing the at least one of the plurality of first diffusion layers on the first face and electrically connected to the at least one of the plurality of first diffusion layers.

8. A semiconductor device comprising:
a semiconductor substrate;
a cell region on a side of a first face of the semiconductor substrate; and
a termination region on an outer side of the cell region on the side of the first face of the semiconductor substrate,
wherein the termination region surrounds the cell region and includes a plurality of first diffusion layers containing a first conductivity type impurity,
wherein in a cross-section of the termination region in a first direction perpendicular to the first face, at least one of the plurality of first diffusion layers includes:
a first region extending in the first direction from the first face toward a second face of the semiconductor substrate, and
a second region extending in a second direction orthogonal to the first direction from the first region,
wherein a concentration of the first conductivity type impurity contained in the second region is lower than a concentration of the first conductivity type impurity contained in the first region, and
wherein the cell region comprises:
a second diffusion layer contacting the at least one of the plurality of first diffusion layers disposed closest to the cell region, a gate electrode extending through the second diffusion layer from the first face, a gate insulation film electrically insulating the gate electrode from the second diffusion layer, and a third diffusion layer opposing the gate electrode via the gate insulation film within the second diffusion layer and containing a second conductivity type impurity.

9. The semiconductor device according to claim 8, wherein the second diffusion layer has a concentration of the first conductivity type impurity that is lower than a concentration of the first conductivity type impurity of the at least one of the plurality of first diffusion layers.

10. The semiconductor device according to claim 8, wherein the second region extends on an outer side of the first region, an inner side of the first region, or both the outer and inner sides of the first region.

11. The semiconductor device according to claim 10, wherein a bottom portion of the second region is disposed in a position shallower or a position deeper than a bottom portion of the first region.

12. A manufacturing method for a semiconductor device, the semiconductor device including a semiconductor substrate, a cell region on a side of a first face of the semiconductor substrate, and a termination region on an outer side of the cell region on the side of the first face of the semiconductor substrate, the manufacturing method comprising:

forming, in the termination region, a plurality of first diffusion layers containing a first conductivity type impurity so as to surround the cell region, wherein in a cross-section of the termination region in a first direction perpendicular to the first face, in at least one of the plurality of first diffusion layers, a first region extending in the first direction from the first face toward a second face of the semiconductor substrate, and a second region extending in a second direction orthogonal to the first direction from the first region are formed, wherein a concentration of the first conductivity type impurity contained in the second region is lower than a concentration of the first conductivity type impurity contained in the first region, and wherein a gradient of the concentration of the first conductivity type impurity is formed in the second region.

13. The manufacturing method for the semiconductor device according to claim 12, wherein a width of a bottom portion of the at least one of the plurality of first diffusion layers is formed greater than a width of an upper portion, positioned on the side of the first face, of the at least one of the plurality of first diffusion layers.

14. The manufacturing method for the semiconductor device according to claim 12, wherein a second conductive first semiconductor layer of a second conductivity type is formed on the second region of the semiconductor substrate.

15. The manufacturing method for the semiconductor device according to claim 12, wherein in the second region, the concentration of the first conductivity type impurity is formed so as to be reduced from an inner end portion contacting the first region toward an outer end portion farthest from the first region.

16. The manufacturing method for the semiconductor device according to claim 12, wherein the second region is formed so as to extend on an outer side of the first region, an inner side of the first region, or both the outer and inner sides of the first region.

17. The manufacturing method for the semiconductor device according to claim 16, wherein a bottom portion of the second region is formed in a position shallower or a position deeper than a bottom portion of the first region.

18. The manufacturing method for the semiconductor device according to claim 12, wherein in the termination region, a conductive layer opposing the at least one of the plurality of first diffusion layers on the first face and electrically connected to the at least one of the plurality of first diffusion layers is further formed.

19. The manufacturing method for the semiconductor device according to claim 12, the method forming, in the cell region:

a second diffusion layer contacting the at least one of the plurality of first diffusion layers disposed closest to the cell region, a gate electrode extending through the second diffusion layer from the first face, a gate insulation film electrically insulating the gate electrode from the second diffusion layer, and a third diffusion layer opposing the gate electrode via the gate insulation film within the second diffusion layer and containing a second conductivity type impurity.

20. The manufacturing method for the semiconductor device according to claim 19, wherein the second diffusion layer has a concentration of the first conductivity type impurity that is lower than a concentration of the first conductivity type impurity of the at least one of the plurality of first diffusion layers.

* * * * *